(12) United States Patent
Park et al.

(10) Patent No.: US 10,504,303 B2
(45) Date of Patent: Dec. 10, 2019

(54) SERVER, VEHICLE COMMUNICATING WITH THE SERVER, AND CONTROL METHOD OF THE SERVER

(71) Applicants: Hyundai Motor Company, Seoul (KR); Kia Motors Corporation, Seoul (KR)

(72) Inventors: Jongpil Park, Seoul (KR); Yunjoong Park, Seoul (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 0 days.

(21) Appl. No.: 15/946,164

(22) Filed: Apr. 5, 2018

(65) Prior Publication Data

US 2019/0139326 A1   May 9, 2019

(30) Foreign Application Priority Data

Nov. 6, 2017  (KR) .................. 10-2017-0146501

(51) Int. Cl.
| | |
|---|---|
| *G07C 5/00* | (2006.01) |
| *G01R 31/36* | (2019.01) |
| *B60W 10/06* | (2006.01) |
| *G01R 31/382* | (2019.01) |

(52) U.S. Cl.
CPC ............ *G07C 5/008* (2013.01); *B60W 10/06* (2013.01); *G01R 31/382* (2019.01); *G07C 5/004* (2013.01)

(58) Field of Classification Search
CPC ...... G07C 5/008; G01R 31/382; B60W 10/06
See application file for complete search history.

(56) References Cited

U.S. PATENT DOCUMENTS

| | | | |
|---|---|---|---|
| 9,238,410 B2 | 1/2016 | Nakagawa | |
| 2011/0078092 A1* | 3/2011 | Kim .................. | B60L 50/66 705/412 |
| 2013/0015982 A1* | 1/2013 | Matsumoto ............ | G06Q 50/06 340/870.02 |
| 2013/0257344 A1* | 10/2013 | Millet .................... | B60L 53/53 320/104 |
| 2015/0222708 A1* | 8/2015 | Addepalli ............. | H04W 4/046 709/217 |
| 2015/0277890 A1* | 10/2015 | Throop .................. | B60L 58/13 717/172 |

* cited by examiner

*Primary Examiner* — Sisay Yacob
(74) *Attorney, Agent, or Firm* — Slater Matsil, LLP

(57) ABSTRACT

A vehicle includes a communication device communicating with a server. A battery supplies power to an electronic device. A battery manager monitors a state of charge (SoC) of the battery and generates a trigger signal based on the SoC of the battery. A controller is configured to control the communication device to send information about battery discharge to the server upon reception of the trigger signal, and to control the information about battery discharge to be sent again if it is determined that sending of the information about battery discharge is unavailable.

21 Claims, 17 Drawing Sheets

SERVER, VEHICLE COMMUNICATING WITH THE SERVER, AND CONTROL METHOD OF THE SERVER

CROSS-REFERENCE TO RELATED APPLICATIONS

This application claims priority to Korean Patent Application No. 10-2017-0146501, filed in the Korean Intellectual Property Office on Nov. 6, 2017, which application is hereby incorporated herein by reference.

TECHNICAL FIELD

Embodiments of the present disclosure relate to a server providing information about battery discharge, vehicle having the server, and control method of the server.

BACKGROUND

Vehicles are machines driven on wheels to run on the road.

The vehicles include motor vehicles (general engine-driven cars) driven with mechanical power produced by burning oil fuel, such as gasoline and diesel after switching on the ignition using a battery, and eco-friendly vehicles driven by electrical power of a battery to reduce the amount of harmful fuel emissions and increase fuel efficiency.

The echo-friendly vehicles include electric vehicles having a rechargeable power unit comprised of a battery and a motor, rotating the motor with electricity charged in the battery, driving the wheels using the rotation of the motor, hybrid vehicles driven by having an engine, a battery, and a motor and controlling mechanical power of the engine and electrical power of the motor, and hydrogen fuel cell vehicles.

These vehicles include a battery for switching on the ignition or for switching on the ignition and supplying driving power, and the battery also supplies power to operate various devices equipped in the vehicle.

The battery is discharged due to the dark current flowing in various electronic devices in the vehicle while the vehicle is turned off, and the discharge amount increases with the passage of the turn-off time. The battery may not start up the vehicle when discharged below a reference level.

SUMMARY

The present disclosure provides a server and control method thereof, by which the server sends notification information about a battery to a terminal based on the history of reception of information about battery discharge when receiving state-of-charge information of the battery from the vehicle.

The present disclosure also provides a server and control method thereof, by which the server changes a reference level of a battery based on a surrounding condition and sends the changed reference level to the vehicle.

The present disclosure also provides a vehicle that sends information about battery discharge again when communication with the server is unavailable, sends state-of-charge information of the battery to the server when the vehicle is turned off, and when receiving a reference level of the battery sent from the server, changes a stored reference level to the received reference level.

In accordance with one aspect of the present disclosure, a vehicle includes a communication device communicating with a server, a battery supplying power to at least one electronic device, a battery manager monitoring a state of charge (SoC) of the battery and generating a trigger signal based on the SoC of the battery, and a controller configured to control the communication device to send information about battery discharge to the server upon reception of the trigger signal, and to control the information about battery discharge to be sent again if it is determined that sending of the information about battery discharge is unavailable.

The battery manager comprises a current detector detecting a current of the battery and a monitoring device obtaining a charge level corresponding to the detected current and generating a trigger signal if the obtained charge level is a reference level.

The controller is configured to, upon reception of an instruction to change reference level and a reference level from the server, change a stored reference level to the received reference level. The monitoring device generates the trigger signal based on the changed reference level.

The vehicle may further include a starter receiving a command to turn on the ignition. The monitoring device generating a trigger signal based on the stored reference level until the command to turn on the ignition is received, and generating the trigger signal based on the changed reference level upon reception of the command to turn on the ignition.

The vehicle may further include a starter receiving a command to turn on the ignition and a command to turn off the ignition. The controller is configured to, upon reception of the command to turn off the ignition after receiving the command to turn on the ignition, control the communication device to send the SoC information of the battery to the server.

The controller is configured to send the information about battery discharge as many times as a predetermined number of times when communication with the communication device is unavailable.

The controller is configured to be woken up upon reception of the trigger signal, and enters to a sleep state after sending the information about battery discharge as many times as the predetermined number of times.

The battery manager comprises a current detector detecting a current of the battery; and a monitoring device obtaining a charge level corresponding to the detected current, generating a first trigger signal when the obtained charge level is equal to a first reference level, and generating a second trigger signal when the obtained charge level is equal to a second reference level. The second reference level is lower than the first reference level.

The controller is configured to be woken up upon reception of the first trigger signal, control the communication device to send information about caution of battery discharge as many times as a predetermined number of times, be woken up upon reception of the second trigger signal, control the communication device to send information about danger of battery discharge as many times as a predetermined number of times, and enter to a sleep state after sending at least one of the information about caution of battery discharge and the information about danger of battery discharge as many times as a predetermined number of times.

In accordance with another aspect of the present disclosure, a server includes a communication device communicating with a vehicle and a terminal. A controller is configured to, upon reception of information about battery discharge from the vehicle, store the received information about battery discharge, control the communication device to send notification information about battery discharge to the terminal, check history of having received information about battery discharge upon reception of an ignition-off signal and information about a state of charge (SoC) of the battery from the vehicle, and control the communication device to send notification information about battery discharge to the terminal if there is no history of having received the information about battery discharge.

The controller is configured to, upon reception of an ignition-on signal and SoC information of the battery from the vehicle, determine a charge amount of the battery corresponding to the received SoC information, and control the communication device to send the determined charge amount of the battery to the terminal.

The controller is configured to determine a charge level corresponding to the SoC information of the battery, and control the communication device to send notification information about battery discharge when the determined charge level is equal to or less than a reference level and there is no history of having received information about battery discharge.

The controller is configured to control sending of the notification information about battery discharge to be blocked when the determined charge level is equal to or less than the reference level and there is the history of having received information about battery discharge.

The controller is configured to check whether there is stored history of having received information about battery discharge before an ignition-on signal is received from the vehicle.

The controller is configured to receive surrounding information of the vehicle, determine a reference level corresponding to the received surrounding information, change a stored reference level to the determined reference level when the determined reference level is different from the stored reference level, and control the communication device to send the determined reference level and a command to change reference level to the vehicle.

The controller is configured to determine whether an ignition-off signal and SoC information of the battery are received from the vehicle when a reference level of the battery of the vehicle is changed, determine a charge level corresponding to the SoC information of the battery when it is determined that the ignition-off signal and the SoC information of the battery are received from the vehicle, and control the communication device to send notification information about battery discharge to the terminal based on history of having received information about battery discharge when the determined charge level is equal to or less than the changed reference level.

The controller is configured to control the communication device to send notification information corresponding to caution of battery discharge to the terminal upon reception of information about the caution of battery discharge from the vehicle, and control the communication device to send notification information corresponding to danger of battery discharge to the terminal upon reception of information about the danger of battery discharge from the vehicle.

The controller is configured to enter to a sleep state after sending at least one of the information about caution of battery discharge and the information about danger of battery discharge.

In accordance with another aspect of the present disclosure, a control method of a server in communication with a vehicle and a terminal, the method includes, upon reception of information about battery discharge from the vehicle, storing the received information about battery discharge and controlling a communication device to send notification information about battery discharge to the terminal. Upon reception of an ignition-off signal and state-of charge (SoC) information of the battery, a charge level corresponding to the SoC information of the battery is determined. It is checked whether there is history of having received information about battery discharge received or stored before an ignition-on signal is received from the vehicle when the determined charge level is equal to or less than a reference level. Notification information about battery discharge is sent to the terminal when there is no history of having received the information about battery discharge.

The control method may further include blocking the notification information about battery discharge from being sent when there is the history of having received the information about battery discharge when the determined charge level is equal to or less than the reference level; and deleting the stored history of having received the information about battery discharge.

The control method may further include, receiving surrounding information of the vehicle from the vehicle, determining a reference level corresponding to the received surrounding information, changing the stored reference level to the determined reference level when the determined reference level is different from the stored reference level, and sending the determined reference level and an instruction to change reference level to the vehicle.

The control method may further include determining whether an ignition-off signal and the SoC information of the battery are received from the vehicle when a reference level of the battery of the vehicle is changed, determining a charge level corresponding to SoC information of the battery when it is determined that an ignition-off signal and the SoC information of the battery are received; checking whether there is history of having received information about battery discharge received or stored before an ignition-on signal is received from the vehicle when the determined charge level is equal to or less than the changed reference level; and blocking the notification information about battery discharge from being sent when there is the history of having received the information about battery discharge; and sending the notification information about battery discharge to the terminal when there is no history of having received the information about battery discharge.

The control method may further include, determining a charge amount of the battery corresponding to SoC information of the battery upon reception of an ignition-on signal and the SoC information of the battery from the vehicle when the information about battery discharge has been received and stored, and sending the determined charge amount of the battery to the terminal.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION OF ILLUSTRATIVE EMBODIMENTS

Embodiments of the present disclosure will now be described with reference to accompanying drawings.

Figure 1:
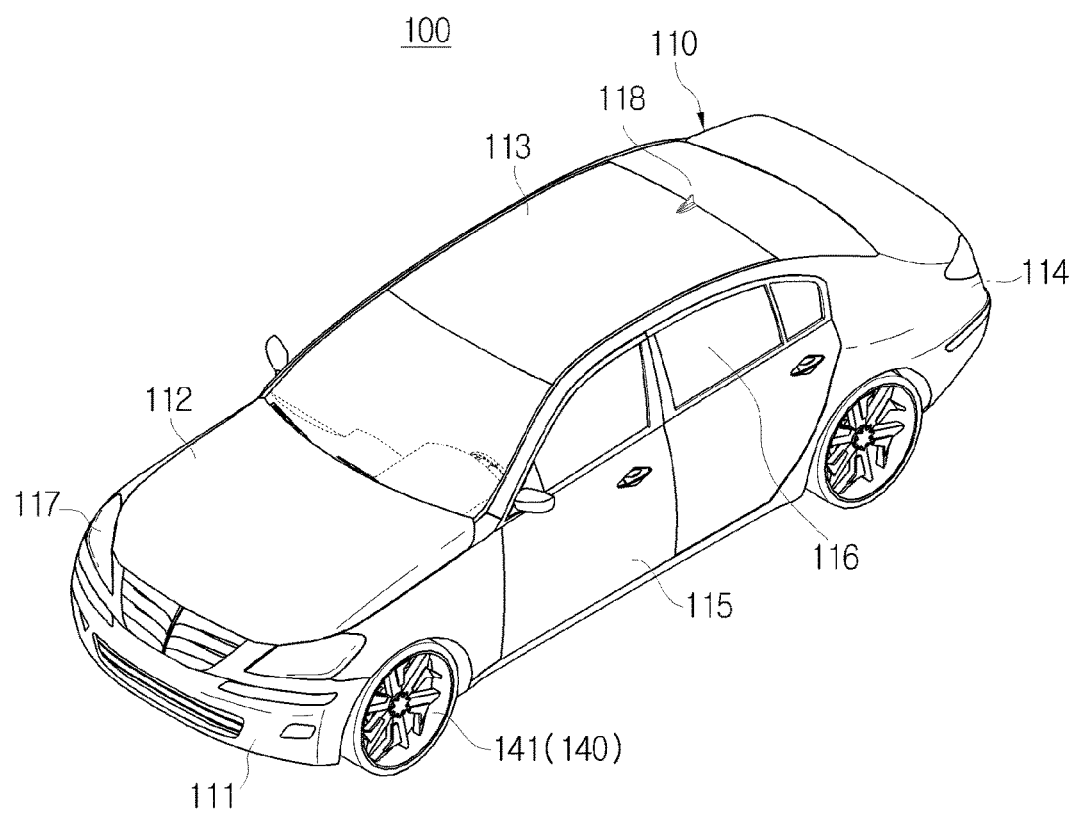
FIG. 1 illustrates an exterior of the body of a vehicle according to an embodiment of the present disclosure.
Figure 2:
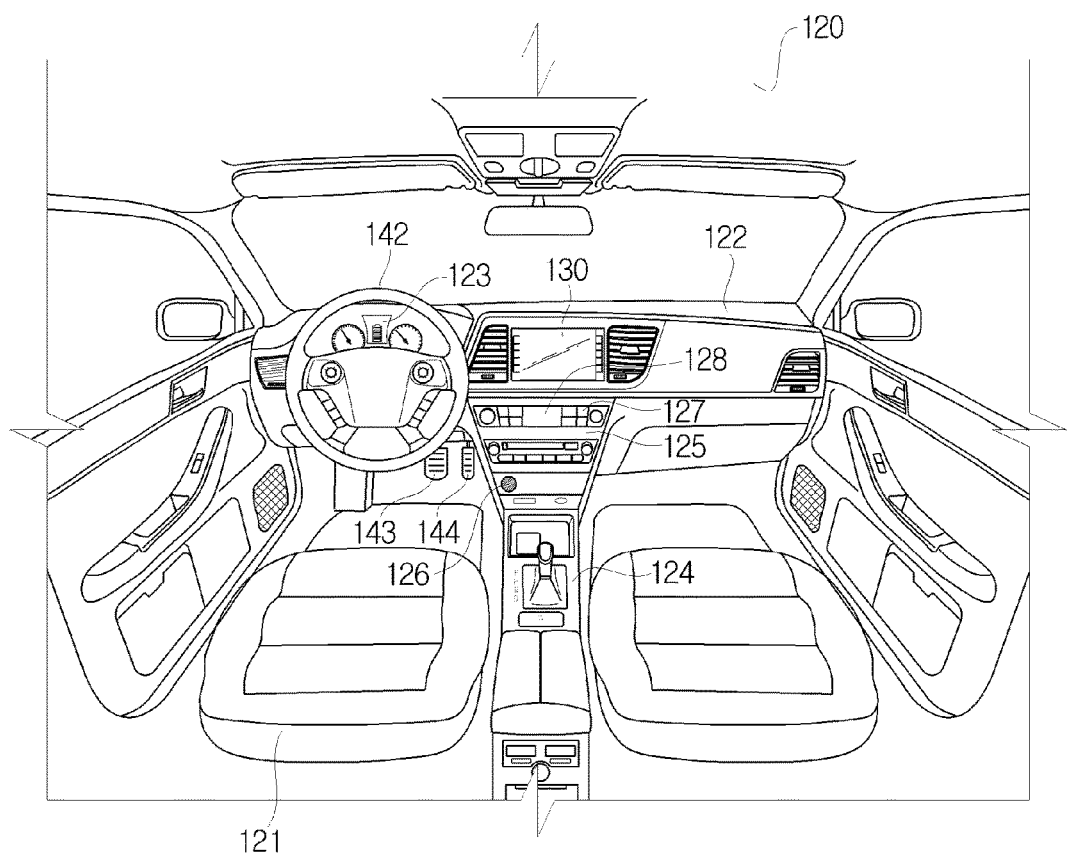
FIG. 2 illustrates an interior of the body of a vehicle according to an embodiment of the present disclosure.

FIG. 1 illustrates an exterior of the body of a vehicle according to an embodiment of the present disclosure, and FIG. 2 illustrates an interior of the body of a vehicle according to an embodiment of the present disclosure.

The vehicle 100 includes a car body with exterior and interior parts 110 and 120, and a chassis 140, which is a remaining part except the car body and on which mechanical devices required for driving are installed.

Referring to FIG. 1, the exterior part 110 of the body includes a front bumper 111, a hood 112, a roof panel 113, a rear bumper 114, front, back, left and right doors 115, and window glasses 116 equipped in the front, back, left and right doors 115 to be opened/closed.

The exterior part 110 of the body may also include fillers placed on the border between the window glasses 116 of the doors 115, side mirrors for providing views behind the vehicle 100, and lamps 117 for enabling the user to easily catch surrounding information while keeping his/her eyes forward and performing a signaling or communication function for other vehicles and pedestrians.

The exterior part 110 may include an antenna 118 for performing vehicle to everything (V2X) communication such as vehicle to vehicle (V2V) communication and vehicle to infrastructure (V2I) communication over a wireless network for vehicle.

The antenna 118 may be mounted on the roof panel 113 of the vehicle 100. Alternatively, the antenna 118 may be mounted on the rear window glass of the vehicle 100.

Referring to FIG. 2, the interior part 120 of the body includes seats 121 for people to sit thereon, a dashboard 122, an instrument panel (or cluster) 123 placed on the dashboard 122 containing gauges and indicators, such as a tachometer, speedometer, water temperature gauge, fuel gauge, turn signal indicator, head light indicator, warning light, seat belt warning light, odometer, gearshift position indicator, door open warning light, low fuel warning light, low oil pressure warning light, etc., a center fascia 124 having air vents and throttle of an air conditioner (AC) arranged thereon, a head unit 125 placed on the center fascia 124 for receiving commands to operate the AC and the audio system, and a starter 126 placed on the center fascia 124 for receiving a command to turn on or off the ignition.

The vehicle 100 may further include a transmission lever placed on the center fascia 124 for receiving a manipulation position, and an electronic parking brake (EPB) button placed around the transmission lever or the head unit 125 for receiving a command to operate an EPB (not shown).

The vehicle 100 may further include an input unit 127 for receiving commands to operate various functions.

The input unit 127 may be arranged on the head unit 125 and center fascia 124, including at least one mechanical button, such as ON/OFF buttons for operation of various functions, buttons to change settings of various functions, etc.

The input unit 127 may also further include a jog dial (not shown) or a touch pad for the user to enter a command to move or select a cursor displayed on the display of a user interface 130.

The jog dial or touch pad may be arranged on the center fascia 124.

The vehicle 100 may further include a display 128 arranged in the head unit 125 for displaying information about an activated function and information input by the user.

The user interface 130 may be further equipped in the vehicle for user convenience.

The user interface 130 may be installed by being buried in the dashboard 122 or being attached to the dashboard 122.

The user interface 130 may also display information about a current function being performed among audio function, video function, navigation function, Digital Multimedia Broadcasting (DMB) function, and radio function, and information input by the user.

The chassis 140 of the vehicle 100 is a frame to support the car body 110, 120, with car wheels 141 equipped at front and rear and on the left and right of the vehicle 100, power systems to generate power for driving the vehicle 100 and controlling the generated power to apply the controlled power to the car wheels 141, a steering system, a braking system for applying braking power to the car wheels 141, and a suspension system.

The vehicle 100 may include a steering wheel 142 of the steering system for controlling the driving direction, a brake pedal 143 pressed by the user having intention of braking, and an accelerator pedal 144 pressed by the user having intention of acceleration.

The vehicle further includes various safety systems for safety of the driver and passengers.

The safety systems may include an airbag control unit for the purpose of the safety of driver and passengers in case of car crashes and an Electronic Stability Control (ESC) unit for stabilizing the vehicle's position while the vehicle 1 is accelerating or cornering.

The vehicle 100 further includes a battery 150a (see FIG. 3) electrically connected to a terminal, audio system, indoor lighting system, start motor, and other electronic devices for supplying power.

The battery is charged while the vehicle 100 is driven.

Specifically, when the vehicle starts driving, the generator is driven by rotational force of the engine and produce power, which charges the battery.

The vehicle 100 may further include a communication device 170 for performing communication between various electronic devices, communication with a terminal for user, communication with a storage medium, and communication with an external device.

The external device may include at least one of another vehicle, a server, and an infrastructure.

Figure 3:
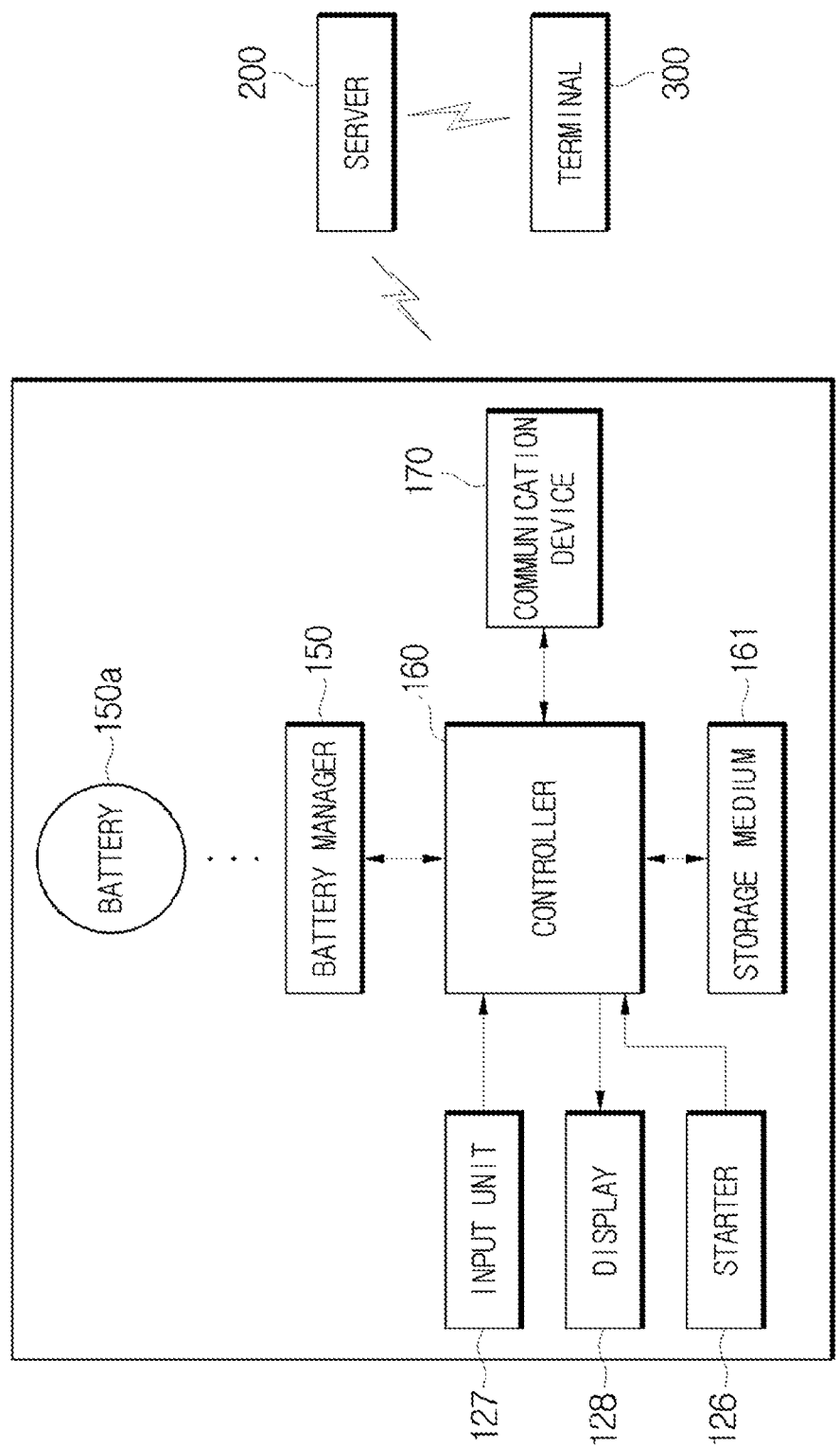
FIG. 3 is a control block diagram of a vehicle, according to an embodiment of the present disclosure.
Figure 4:
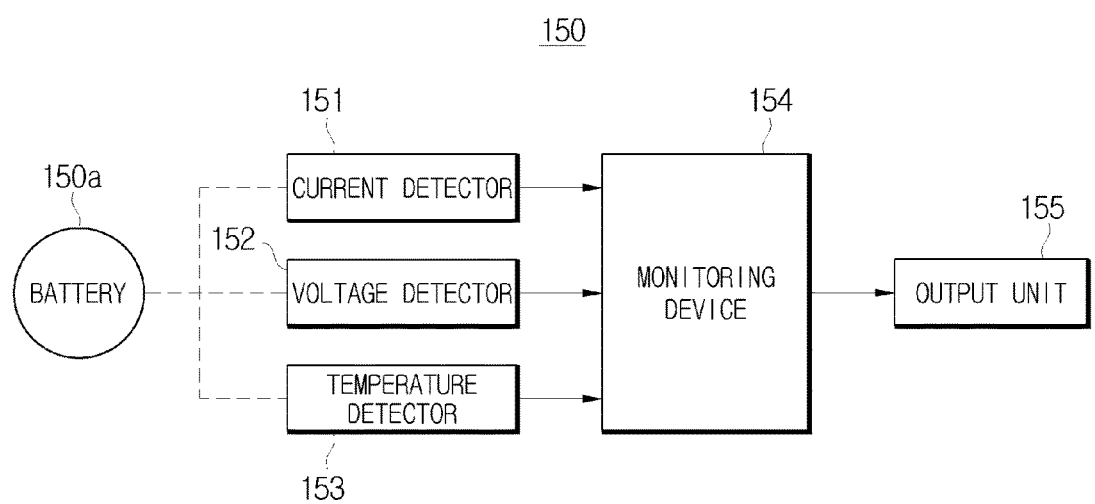
FIG. 4 is a detailed block diagram of a battery manager equipped in a vehicle, according to an embodiment of the present disclosure.

FIG. 3 is a control block diagram of a vehicle, according to an embodiment of the present disclosure, and FIG. 4 is a detailed block diagram of a battery manager equipped in a vehicle, according to an embodiment of the present disclosure.

A vehicle includes the starter 126, the input unit 127, the display 128, a battery manager 150, a controller 160, a storage medium 161, and the communication device 170.

The starter 126 may include a start button to receive a command to turn on or off the ignition. The start button may be of a push type. The starter 126 may also include a key part to receive a key signal of a key inserted thereto.

The starter 126 may further include a start motor (not shown). When the start button is pressed, power of the battery 150a is supplied to the start motor, which in turn operates to start the engine (not shown).

If the vehicle is a hard type hybrid vehicle or an electric vehicle, power of the battery is supplied to a driving motor to start the driving motor when the start button is pressed.

If the vehicle is a soft type hybrid vehicle, power of the battery is supplied to the driving motor and the engine to start both the driving motor and the engine when the start button is pressed.

The input unit 127 may receive a command to turn on or off at least one of a plurality of functions, and receive a command to operate the at least one function.

The input unit 127 may receive a command to turn on or off communication with a server 200.

The input unit 127 may also receive a selection of the server 200 to send various information of the vehicle and receive identification information of a terminal 300 to output notification information about a battery of the vehicle.

For example, the various information of the vehicle may include information about a state of driving, information about battery discharge (or battery discharge information), information about a state of charge (SoC) (or SoC information) of the battery, etc.

The SoC information of the battery may include a charge amount of the battery and a charge level corresponding to the charge amount of the battery.

The display 128 may display information about an operation of a function being performed.

For example, the display 128 may display information regarding phone calls, information about content being output through the user interface 130, information regarding a song played, or external broadcasting information.

The display 128 may also display identification information of the server 200 and the terminal 300, which are available for communication.

The display 128 may also display information about availability/unavailability of communication with the server 200.

The battery manager 150 may monitor the state of charge of the battery, send the SoC information about the monitored state of charge to the controller 160, determine a charge level corresponding to the SoC of the battery, and generate a trigger signal if the charge level corresponds to a reference level.

Upon reception of a new reference level, the battery manager 150 may change a reference level stored in advance to the received reference level and generate a trigger signal based on the changed reference level.

Referring to FIG. 4, the battery manager 150 may include a current detector 151, a voltage detector 152, a temperature detector 153, a monitoring device 154, and an output unit 55.

The battery 150a supplies power to the start motor upon reception of a command to turn on the ignition, supplies power to various electronic devices equipped in the vehicle, and is charged while the vehicle is being driven.

The battery 150a cuts off the power supplied to the various electronic devices if a command to turn off the ignition is input.

The battery 150a supplies current to the various electronic devices no matter whether the vehicle is turned on or off for the electronic devices to perform their basic operations. This current is called the dark current.

For example, such devices as black boxes or rear surveillance cameras among the various electronic devices keep on receiving power from the battery 150a to continue to take surrounding images even when the vehicle is turned off and parked.

That is, the battery 150a may be continuously discharged after the vehicle is turned off.

The battery manager 150 is a detector for monitoring and detecting an SoC of the battery, including the current detector 151.

For example, the current detector 151 detects the current of the battery 15oa.

The battery manager 150 is a detector for monitoring and detecting an SoC of the battery, including the voltage detector 152 and the temperature detector 153.

For example, the voltage detector 152 detects the voltage at an output terminal of the battery 150a.

The temperature detector 153 detects a temperature of the battery 150a.

The monitoring device 154 may also monitor the SoC of the battery 150a in real time while the vehicle is turned off, to prevent start failure of the vehicle when a command to start the vehicle is received.

Furthermore, if the vehicle is a hybrid vehicle, hydrogen fuel cell vehicle, or electric vehicle, the battery manager 150 may monitor the SoC of the battery to prevent the driving motor from being stopped as well.

The monitoring device 164 monitors the SoC of the battery based on the detected current of the battery.

It is also possible for the monitoring device 154 to monitor the SoC of the battery based on the detected current and voltage of the battery.

Alternatively, the monitoring device 154 may monitor the SoC of the battery based on the current, voltage, and temperature of each cell of the battery.

The monitoring device 154 may output information about the monitored SoC of the battery to the controller 160.

The SoC of the battery 150a may include a charge amount of the battery.

The monitoring device 154 stores the charge level corresponding to the current of the battery and stores a reference level of the battery.

The monitoring device 154 may check the charge level corresponding to the detected current and generate a trigger signal if the charge level corresponds to the reference level.

The trigger signal may be a signal to wake up the controller 160 when notification information for preventing discharge of the battery 150a is sent.

The monitoring device 154 may also store a charge level corresponding to the charge amount of the battery.

For example, the monitoring device 154 may obtain a charge amount of the battery corresponding to the current, voltage, and temperature of the battery from a table stored in advance.

The table may have charge amounts of battery matched with corresponding relationships of battery currents, voltages and temperatures.

The monitoring device 154 may check the SoC of the battery upon reception of an instruction to turn off the ignition from the controller 160 and output the SoC information to the controller 160.

When the vehicle is started and an instruction to change the reference level of the battery is received, the monitoring device 154 may change the stored reference level of the battery to the received reference level of the battery, and upon reception of an instruction to turn off the ignition, generate a trigger signal based on the changed reference level of the battery.

The monitoring device 154 prevents the lifespan of the battery from being reduced by preventing the battery from being charged to more than the maximum charge amount.

The output unit 155 sends the trigger signal generated by the monitoring device 154 to the controller 160.

When a first trigger signal is generated by the monitoring device 154, the output unit 155 may send the first trigger signal to the controller 160, and when a second trigger signal is generated by the monitoring device 154, the output unit 155 may send the second trigger signal to the controller 160.

The output unit 155 sends the SoC information monitored by the monitoring device 154 to the controller 160. The SoC information of the battery may be information about a charge amount of the battery. The SoC information may also be a charge level of the battery.

The output unit 155 may be an interface to input or output signals.

The controller 160 communicates with the battery manager 150.

The controller 160 may be woken up upon reception of a trigger signal while the vehicle is turned off.

The controller 160 receives SoC information from the battery manager 150. The SoC information of the battery may include a charge amount of the battery. The controller 160 may control the communication device 170 to communicate with the server 200.

The controller 160 sends information about battery discharge to the server 200 upon reception of a trigger signal from the battery manager 150 while the vehicle is parked, i.e., the vehicle is turned off.

The information about battery discharge is information indicating that the battery is discharged to a reference level, which may be information requesting the user to charge the battery.

If the controller 160 determines that communication with the server 200 is unavailable in sending the information about battery discharge, the controller 160 sends the information about battery discharge again to the server 200.

In this regard, if the controller 160 determines that communication with the server 200 is unavailable in sending the information about battery discharge, the controller 160 may send the information about battery discharge as many times as the number of times set in advance.

The controller 160 is woken up upon reception of a trigger signal, and enters into a sleep state after it sends the information about battery discharge as many times as the number of times set in advance.

The controller 160 controls charging of the battery 150a when receiving a command to turn on the ignition.

Upon reception of the command to turn on the ignition, the controller 160 operates the start motor as a generator to produce power, enabling the battery to be charged with the power.

Furthermore, upon reception of the command to turn on the ignition, the controller 160 may control operation of an extra generator to produce power, enabling the battery to be charged with the power.

The controller 160 may also send information about a driving state of the vehicle to the server 200 while the vehicle is driven, and may send the SoC information of the battery to the server 200.

The information about a driving state of the vehicle may include a traveled distance, travel time, driving speed, time at which the vehicle is stopped, etc.

The vehicle may further include a speed detector (not shown) for detecting the driving speed.

Upon reception of a command to turn off the ignition, the controller 160 receives the SoC information of the battery from the battery manager 150 and controls the communication device 170 to send the SoC information to the server 200.

Upon reception of a reference level of the battery from the server 200, the controller 160 changes the reference level of the battery stored in the storage medium 161 to the received reference level of the battery and controls the storage medium 161 to store the changed reference level.

Upon reception of the command to turn on the ignition, the controller 160 determines whether a reference level of the battery is changed and if it is determined that the reference level of the battery is changed, sends the changed reference level of the battery to the battery manager 150.

The controller 160 may also send surrounding information of the location where the vehicle is stopped or parked, i.e., weather and temperature information, to the server 200.

In this regard, the vehicle may further include a temperature detector for detecting temperature and a rain detector to detect the amount of rainfall or snowfall.

The controller 160 may also automatically change the reference level based on the surrounding information of the location where the vehicle is stopped or parked, i.e., weather and temperature information. The controller 160 may send the information about the changed reference level to the server.

The controller 160 may be implemented with a memory (not shown) storing an algorithm to control operation of the components in the vehicle 100 or data about a program that implements the algorithm, and a processor (not shown) carrying out the aforementioned operation using the data stored in the memory. The memory and the processor may be implemented in separate chips. Alternatively, the memory and the processor may be implemented in a single chip.

The storage medium 161 may store information of the server 200 available for communication, and identification information of the terminal 300 for outputting the information of the vehicle.

The storage medium 161 may store the reference level of the battery sent from the server 200.

The storage medium 161 may store a certain interval at which the information about battery discharge is sent.

The storage medium 161 may be a memory implemented with a chip separate from the aforementioned processor in relation to the controller 160, or may be implemented integrally with the processor in a single chip.

The storage medium 161 may be implemented with at least one of a non-volatile memory device, such as cache, read only memory (ROM), programmable ROM (PROM), erasable programmable ROM (EPROM), electrically erasable programmable ROM (EEPROM), a volatile memory device, such as random access memory (RAM), or a storage medium, such as hard disk drive (HDD) or compact disk (CD) ROM, without being limited thereto.

The communication device 170 performs communication with the server 200.

The communication device 170 sends the information about battery discharge and the SoC information of the battery based on a control instruction from the controller 160.

The communication device 170 may also send information about a driving state of the vehicle to the server 200.

The communication device 170 may send the SoC information and information about battery discharge, and information about a driving state of the vehicle, using one of HyperText Transfer Protocol (HTTP) and Short Message Service (SMS).

The HTTP is a communication protocol used to send data over the Internet between a server and a user's Internet browser.

The communication device 170 may further include a Global Positioning System (GPS) receiver (not shown) and send the location of the vehicle to the server 200.

The communication device 170 may perform communication between the battery manager 150 and the controller 160.

The communication device 170 may include one or more components that enable communication with the controller 160, for example, at least one of a short-range communication module, wired communication module, and wireless communication module.

The short-range communication module may include various short range communication modules for transmitting and receiving signals within a short range over a wireless communication network, such as Bluetooth module, an infrared communication module, a radio frequency identification (RFID) communication module, a wireless local access network (WLAN) communication module, a near field communication (NFC) module, a Zigbee communication module, etc.

The wired communication module may include not only one of various wired communication modules, such as a controller area network (CAN) communication module, a local area network (LAN) module, a wide area network (WAN) module, or a value added network (VAN) module, but also one of various cable communication modules, such as a universal serial bus (USB), a high definition multimedia interface (HDMI), a digital visual interface (DVI), recommended standard (RS) 232, a power cable, or a plain old telephone service (POTS).

The wired communication module may further include a Local Interconnect Network (LIN).

The wireless communication module may include a wireless fidelity (WiFi) module, a wireless broadband (Wibro) module, and/or any wireless communication module for supporting various wireless communication schemes, such as a global system for mobile communication (GSM) module, a code division multiple access (CDMA) module, a wideband code division multiple access (WCDMA) module, a universal mobile telecommunications system (UMTS), a time division multiple access (TDMA) module, a long term evolution (LTE) module, etc.

Figure 5:
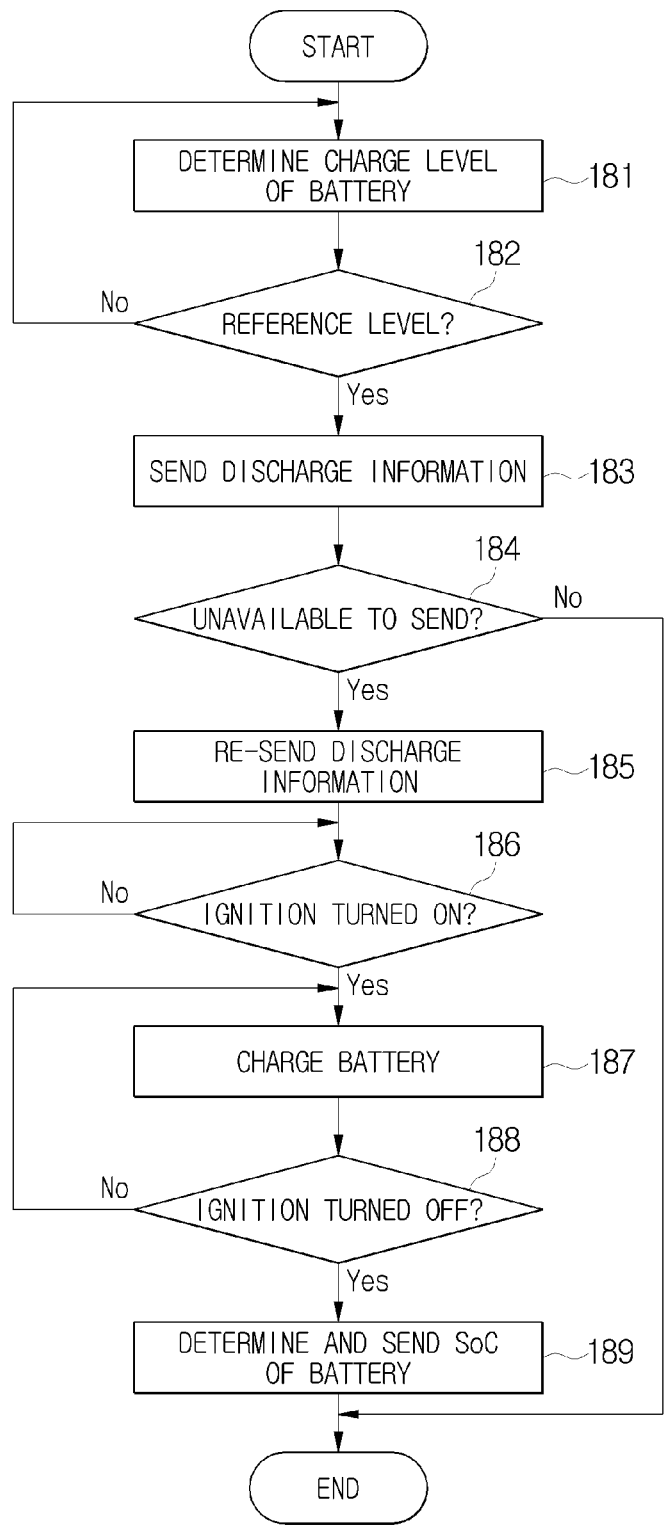
FIG. 5 is a flowchart illustrating a method for controlling a vehicle, according to an embodiment of the present disclosure.

FIG. 5 is a flowchart illustrating a control method of a vehicle, which will be described in connection with FIGS. 6 and 7.

A vehicle detects a current of the battery while the vehicle is turned off, and determines a charge level corresponding to the current of the battery, in 181.

The vehicle may check the SoC of the battery and determine a charge amount of the battery corresponding to the SoC or determine a charge level corresponding to the charge amount.

Determining the charge level of the battery may include determining a discharge amount of the battery.

Determining the charge amount of the battery may include detecting a current, voltage, and temperature of the battery and checking a table stored in advance for a charge amount of the battery corresponding to a relationship of the detected current, voltage and temperature of the battery.

The vehicle determines whether the determined charge level corresponds to a reference level stored in advance, in 182, and if it is determined that the determined charge level corresponds to the reference level, sends the information about battery discharge to the server 183.

The information about battery discharge is information indicating that the battery is discharged to a reference level, which may be information requesting the user to charge the battery.

Specifically, if it is determined that the determined charge level of the battery corresponds to the reference level, the battery manager of the vehicle sends a trigger signal for the controller 160 to be woken up. The controller 160 sends the information about battery discharge to the server upon reception of the trigger signal.

The vehicle determines whether the information about battery discharge is sent, and enters into a sleep state if determining that the information about battery discharge is normally sent.

On the other hand, if determining that sending of the information about battery discharge is unavailable in 184, the vehicle sends the information about battery discharge of the vehicle again to the server, in 185.

Determining whether the information about battery discharge is sent may include whether the information about battery discharge is sent within a predetermined period of time.

Furthermore, determining whether the information about battery discharge is sent may include whether a response signal indicating reception of the information from the server.

The vehicle determines whether the information about battery discharge is sent again, and sends the information about battery discharge to the server again if determining that re-sending of the information about battery discharge is unavailable. The vehicle may attempt to send the information about battery discharge as many times as the predetermined number of times.

The vehicle may enter into the sleep state after sending the information about battery discharge as many times as the predetermined number of times if communication with the server is unavailable.

Figure 6:
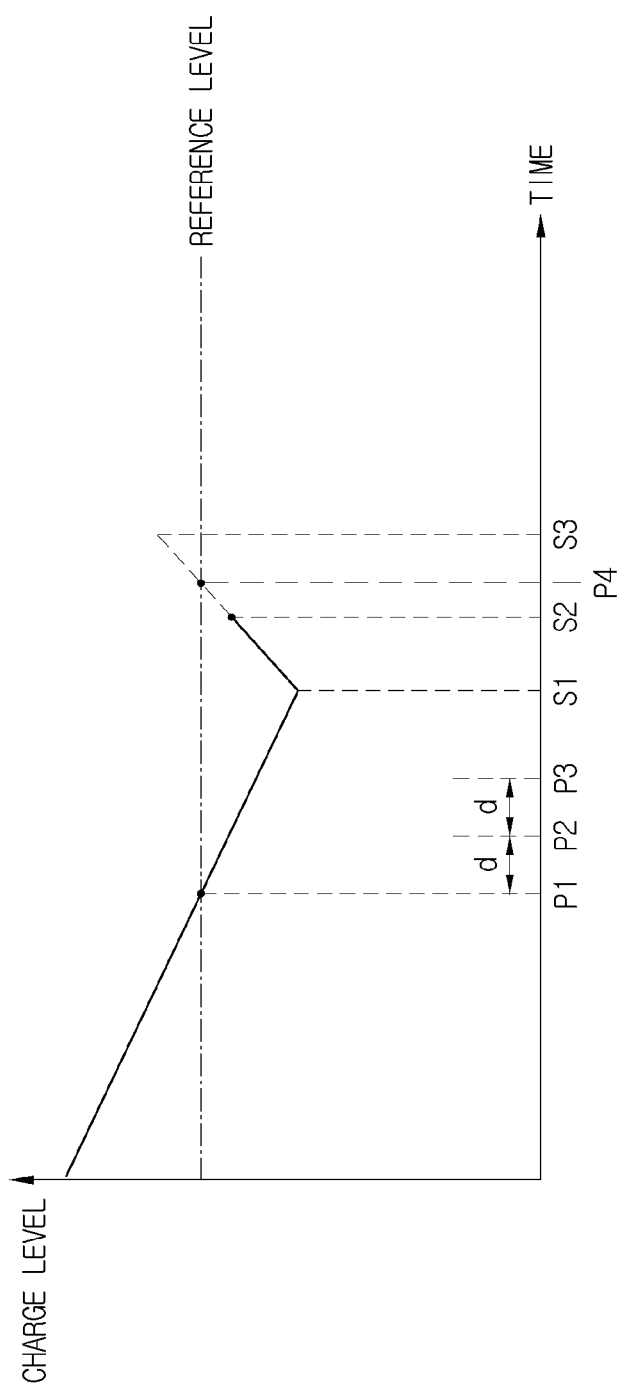
FIGS. 6 and 7 illustrate information about battery discharge and state-of-charge (SoC) information of a battery of a vehicle to be sent, according to an embodiment of the present disclosure.

Referring to FIG. 6, the vehicle sends the information about battery discharge at a point P1 where the charge level is equal to the reference level while the vehicle is turned off, sends the information about battery discharge again at a point P2 after the lapse of a certain period of time d if the communication with the server is unavailable, and sends the information about battery discharge at a point P3 after the lapse of the certain period of time d if the communication with the server continued to be unavailable.

Upon reception of a command to turn on the ignition in 186, the vehicle supplies power of the battery to the start motor to start the engine, and controls driving and driving speed based on manipulation information of the gearshift, pressure information of the accelerator pedal, and pressure information of the brake pedal.

The vehicle charges the battery with the power produced while being driven, in 187.

Specifically, the vehicle operates the start motor as a generator to produce power, or operates an extra generator separately provided from the start motor to produce power.

The vehicle may check an SoC of the battery while the battery is being charged, and stop charging the battery based on a charge amount corresponding to the SoC to prevent the battery from being charged to more than the maximum charge amount.

As shown in FIG. 6, the vehicle may charge the battery from a point S1 at which it turns on the ignition upon reception of a command to turn on the ignition. Accordingly, the charge amount of the battery gradually increases, and the charge level of the battery gradually increases as well.

The vehicle may obtain information about a driving state based on the driving speed detected while the vehicle is being driven, and send the information about the driving state to the server.

The vehicle stops charging the battery when receiving the command to turn off the ignition in 188, checks the SoC of the battery that stops being charged, and sends the SoC information of the battery to the server in 189.

It is also possible for the vehicle to send a charge level of the battery corresponding to the SoC to the server upon reception of a command to turn off the ignition.

As shown in FIG. 6, if the vehicle is turned off at a point S2, the vehicle sends a charge level lower than the reference level to the server, and if the vehicle is turned off at a point S3, the vehicle sends a charge level higher than the reference level to the server.

The battery manager of the vehicle may generate a trigger signal at a point P4 at which the battery is charged to a level that is equal to the reference level while the vehicle is being driven.

At this time, the vehicle does not send the information about battery discharge according to the trigger signal generated while the battery is charged but send the SoC information of the battery, thereby allowing the user to recognize the charge amount of the battery.

The server may also send information helping the user deal with the cautions situation where the battery is discharged, for the user to recognize how to deal with the situation of battery discharge.

The vehicle determines whether an instruction to change the reference level has been received from the server when receiving the command to turn on the ignition, and if determining that the instruction to change the reference level has been received, changes the reference level stored in the storage medium to a received reference level.

The vehicle may generate a trigger signal based on the changed reference level upon reception of a command to turn off the ignition.

Figure 7:
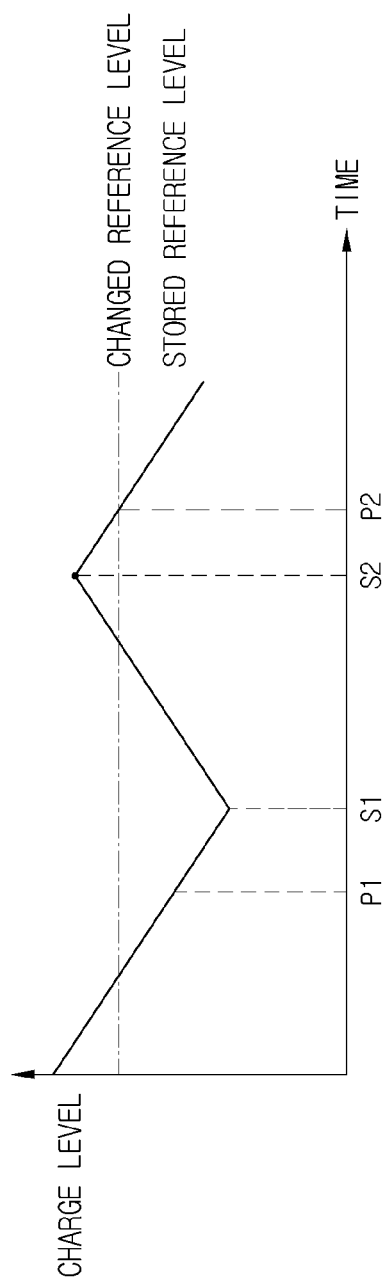

As shown in FIG. 7, the vehicle generates the trigger signal at point P1 at which the charge level of the battery is equal to the reference level while the vehicle is turned off, and sends the information about battery discharge to the server based on the trigger signal.

However, when the vehicle is turned on and the reference level is changed, the vehicle changes the stored reference level to the received reference level and charges the battery while the vehicle is driven to increase the charge level of the battery.

As shown in FIG. 7, the vehicle monitors the battery based on the changed reference level from the point S2 at which the vehicle turns off the ignition. Specifically, the vehicle generates a trigger signal at point P2 at which the charge level of the battery is equal to the changed reference level, and sends the information about battery discharge to the server 200 based on the trigger signal.

Figure 8:
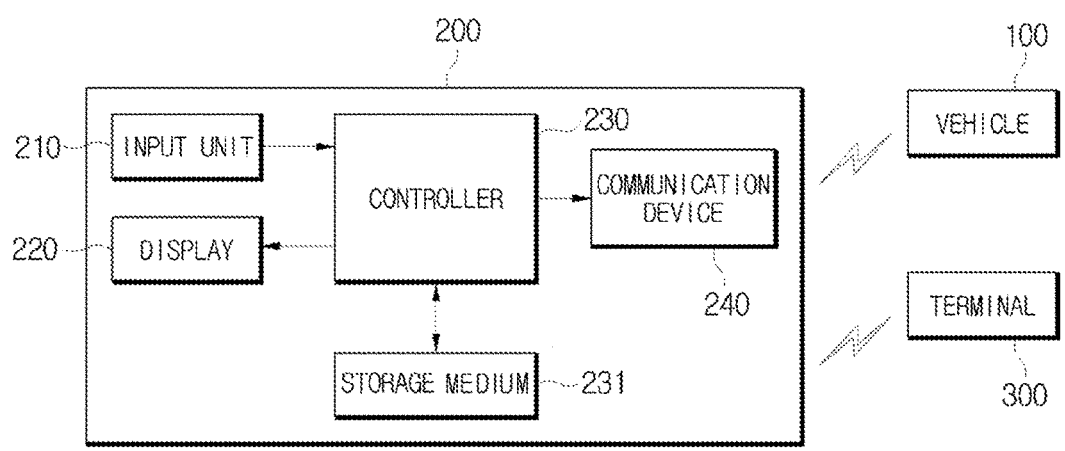
FIG. 8 is a control block diagram of a server communicating with a vehicle, according to an embodiment of the present disclosure.

FIG. 8 is a control block diagram of a server communicating with a vehicle, according to an embodiment of the present disclosure.

The server 200 includes an input unit 210, a display 220, a controller 230, a storage medium 231, and a communication device 240.

The input unit 210 may receive information about users, vehicles of the users, and terminals for registration.

The information about the vehicle may include a communication type, a communication serial number, a registration number, a name of the owner, an address, etc.

The information about the terminal may include a name of the owner, an identification number, a communication type, a communication serial number, a model name, etc.

The display 220 may display the information about a registered vehicle and terminal, information about a vehicle and terminal in communication with, and information about a vehicle unavailable for communication.

Upon reception of information about battery discharge from a vehicle available for communication which is turned off, the controller 230 stores the received information about battery discharge and sends notification information indicating caution of battery discharge to the terminal 300.

Upon reception of the information about battery discharge, the controller 230 may determine a charge amount of the battery based on the SoC information of the battery and send the charge amount of the battery to the terminal 300.

Upon reception of the information about battery discharge from a vehicle, the controller 230 may send a response signal to the vehicle.

Upon reception of the SoC information of the battery from a vehicle which is turned on, the controller 230 may determine a charge amount of the battery based on the SoC information of the battery and send the charge amount of the battery to the terminal 300.

Furthermore, upon reception of the SoC information of the battery from a vehicle which is turned on, the controller 230 may send the SoC information of the battery for the terminal 300 to determine a charge amount of the battery based on the SoC information of the battery and display the charge amount of the battery.

When receiving SoC information of the battery and information about a driving state of a vehicle which is turned on and being driven, the controller 230 may obtain a charge amount of the battery based on the received SoC information of the battery and estimate a time required to fully charge the battery (i.e., to charge the battery to the maximum charge amount) based on the obtained charge amount of the battery and the information about a driving state of the vehicle, and send the estimated time to the terminal 300.

The information about a driving state may include an ignition-on signal, an ignition-off signal, driving speed, travel time, and traveled distance.

Upon reception of the ignition-off signal and SoC information of the battery from a vehicle, the controller 230 obtains a charge level of the battery based on the SoC information of the battery, compares the charge level of the battery with a reference level, determines whether information about battery discharge is stored by being received from the vehicle before the vehicle turns on the ignition if the charge level of the battery is less than the reference level, blocks sending of the information about battery discharge to the terminal if it is determined that there is the stored information about battery discharge, deletes the stored information about battery discharge, and sends the information about battery discharge to the terminal 300 if it is determined that there is no stored information about battery discharge.

The controller 230 may also receive a current of the battery from the vehicle and obtain a charge level based on the current of the battery, or determine a current of the battery corresponding to the SoC information of the battery and obtain a charge level corresponding to the current of the battery, or determine a charge amount corresponding to the SoC information of the battery and obtain a charge level corresponding to the charge amount.

In this way, after the vehicle turns off the ignition, the controller 230 may lead the user through the terminal 300 to drive the vehicle to fully charge the battery.

The controller 230 may block sending the information about battery discharge if the charge level of the battery exceeds the reference level.

In this way, when no information about battery discharge is received because communication with the vehicle, which is turned off, is unavailable, the controller 230 may control information about battery discharge to be sent to the terminal of the user after the vehicle is started based on history of having received information about battery discharge when the vehicle turned off the ignition, to prevent the user from not recognizing the information about battery discharge.

The controller 230 determines a location of the vehicle, determines a surrounding condition of the location, obtains a reference level corresponding to the surrounding condition, determines whether the reference level is equal to the reference level stored in the storage medium 231, and if it is determined that the obtained reference level is different from the reference level stored in the storage medium 231, sends an instruction to change the stored reference level to the obtained reference level and the reference level for change to the vehicle 100.

The controller 230 may obtain the surrounding condition based on the address of the owner of the vehicle and obtain the reference level corresponding to the surrounding condition.

The controller 230 controls the stored reference level of the battery to be changed to the obtained reference level of the battery and the changed reference level to be stored.

When the reference level of the battery is changed, the controller 230 determines whether an ignition-off signal is received from the vehicle, determines whether information about battery discharge is stored by being received from the vehicle before the vehicle turns on the ignition if it is determined that the ignition-off signal has been received from the vehicle, blocks sending of the information about battery discharge to the terminal if it is determined that there is the stored information about battery discharge, deletes the stored information about battery discharge, and sends the information about battery discharge to the terminal 300 if it is determined that there is no stored information about battery discharge.

When the reference level of the battery is changed, the controller 230 compares reference levels before and after change, compares a charge level at a point at which the vehicle turns off the ignition and the changed reference level if the reference level after change is greater than the reference level before change, determines whether information about battery discharge is stored by being received from the vehicle before the vehicle turns on the ignition if the charge level of the battery is less than the changed reference level, blocks sending of the information about battery discharge to the terminal if it is determined that there is the stored information about battery discharge, deletes the stored information about battery discharge, and sends the information about battery discharge to the terminal 300 if it is determined that there is no stored information about battery discharge.

When the reference level after change is less than the reference level before change, the controller 230 compares the charge level at a point at which the ignition is turned off and the changed reference level, and if the charge level is less than the changed reference level, sends the information about battery discharge to the terminal 300 no matter whether the information about battery discharge has been stored by being received from the vehicle before the vehicle is turned on.

Furthermore, the controller 230 may compare a charge level at a point at which the vehicle turns off the ignition and the changed reference level if the reference level after change is less than the reference level before change, determine whether information about battery discharge is stored by being received from the vehicle before the vehicle turns on the ignition if the charge level of the battery is less than the changed reference level, block sending of the information about battery discharge to the terminal if it is determined that there is the stored information about battery discharge, delete the stored information about battery discharge, and send the information about battery discharge to the terminal 300 if it is determined that there is no stored information about battery discharge.

Upon reception of an ignition-on signal and SoC information of the battery from a vehicle while information about battery discharge is received and stored, the controller 230 may determine a charge amount of the battery corresponding to the received SoC information and send the charge amount of the battery to the terminal.

The storage medium 231 may store information about registered users, vehicles, and terminals.

The storage medium 231 may store a reference level of a battery for each registered vehicle.

The storage medium 231 stores received information about battery discharge. The information about battery discharge stored in the storage medium 231 may be deleted under a control instruction from the controller 230.

The storage medium 231 may also store a reference level of a battery, which is changed according to the location of the registered vehicle.

The storage medium 231 may store a reference level table in which reference levels of battery are matched with corresponding relationships of the weather and temperature.

The communication device 240 performs communication with the vehicle 100 and the terminal 300.

The communication device 240 sends notification information about a battery of a vehicle to the terminal 300 based on a control instruction from the controller 230.

The notification information about a battery may include caution of battery discharge and a charge amount of the battery.

The communication device 240 sends information about battery discharge, SoC information, and information about a driving state, which are received from a vehicle, to the controller 230.

The communication device 240 may include a wireless communication module.

The wireless communication module may include a wireless fidelity (Wi-Fi) module, a wireless broadband (Wibro) module, and/or any wireless communication module for supporting various wireless communication schemes, such as a global system for mobile communication (GSM) module, a code division multiple access (CDMA) module, a wideband code division multiple access (WCDMA) module, a universal mobile telecommunications system (UMTS), a time division multiple access (TDMA) module, a long term evolution (LTE) module, etc.

Figure 9:
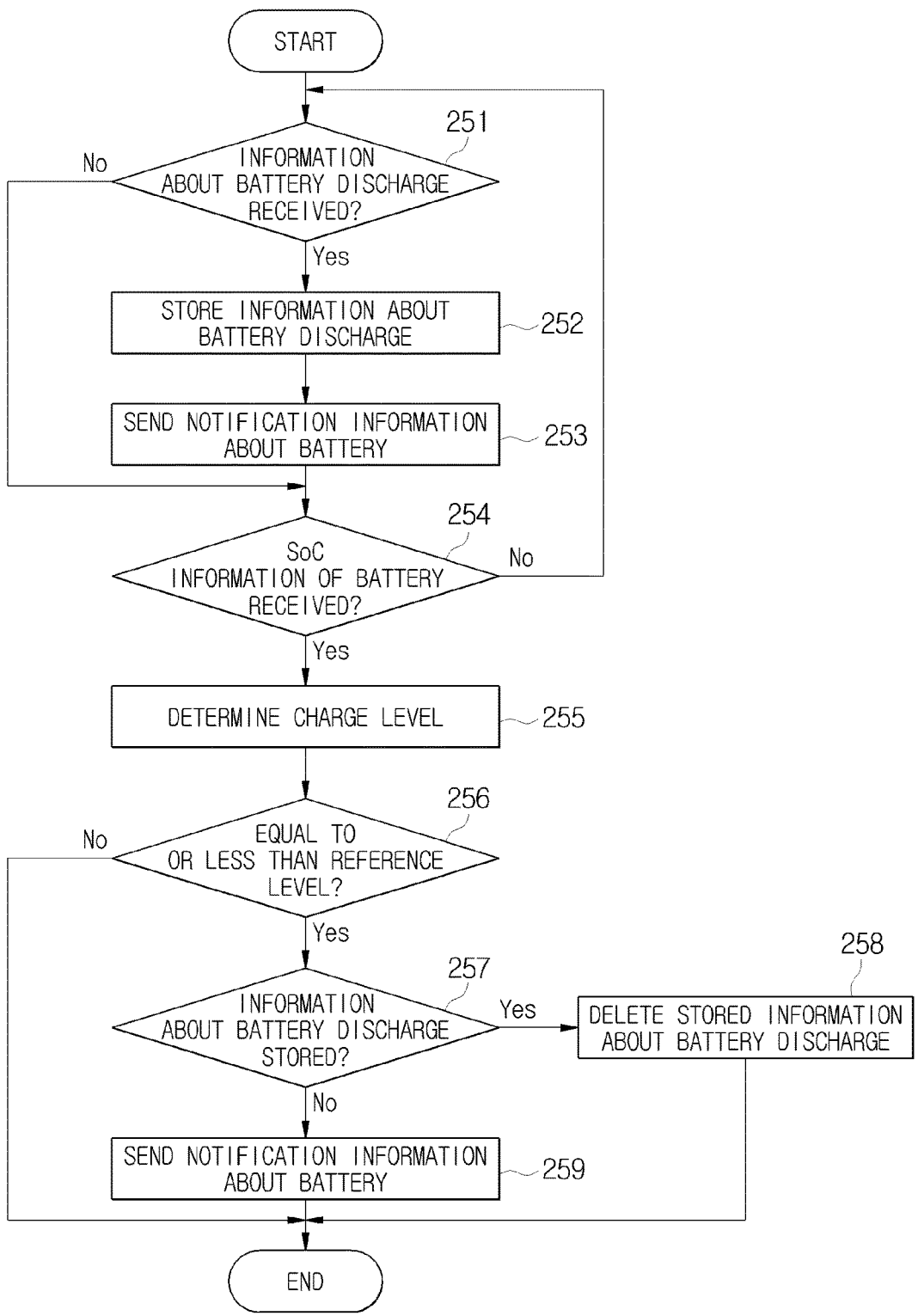
FIG. 9 is a flowchart illustrating a control method of a server communicating with a vehicle, according to an embodiment of the present disclosure.

FIG. 9 is a flowchart illustrating a control method of a server in communication with a vehicle, which will be described in connection with FIG. 10.

When receiving discharge information of a battery from a vehicle, which is turned off, in 251, the server stores the received information about battery discharge, in 252, and sends notification information about caution of battery discharge to the terminal 300, in 253.

Furthermore, upon reception of the information about battery discharge, the server may send a response signal to the vehicle.

Figure 10:
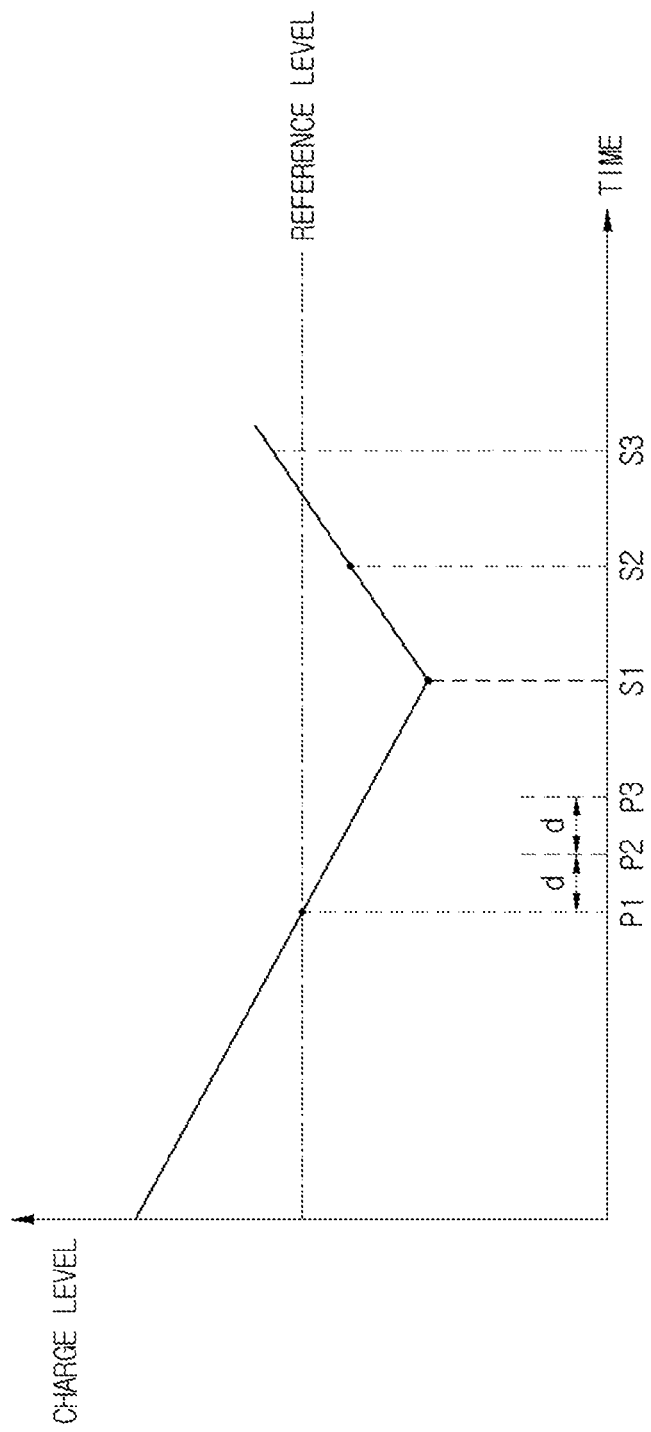
FIGS. 10, 11, 12 and 13 illustrate information about battery discharge and SoC information of a battery of a vehicle received by a server communicating with a vehicle, according to an embodiment of the present disclosure.

Referring to FIG. 10, the server may receive information about battery discharge according to a trigger signal generated while the vehicle is turned off.

Specifically, the server may receive the information about battery discharge according to a trigger signal generated at the point P1 at which the charge level of the battery is equal to the reference level. However, when the server is unavailable to communicate with the vehicle, it may receive the information about battery discharge sent at the point P2 after the lapse of a certain time from the point P1 at which the charge level of the battery is equal to the reference level.

If the communication with the vehicle is still unavailable, the server may receive the information about battery discharge sent at point P3 after the lapse of a certain time from the point P2, and if the communication with the vehicle continues to be unavailable, the server may not receive the information about battery discharge.

When receiving SoC information of a battery and information about a driving state of a vehicle which is turned on and being driven, the server may obtain a charge amount of the battery based on the received SoC information of the battery and estimate a time required to fully charge the battery (i.e., to charge the battery to the maximum charge amount) based on the obtained charge amount of the battery and the information about a driving state of the vehicle, and send the estimated time to the terminal 300.

The information about a driving state may include an ignition-on signal, an ignition-off signal, driving speed, travel time, and traveled distance.

Upon reception of the ignition-off signal and SoC information of the battery from the vehicle being driven, in 254, the server determines a charge amount of the battery based on the received SoC information of the battery and determines a charge level corresponding to the charge amount of the battery, in 255.

If the charge level of the battery exceeds the reference level, the server sends the charge amount of the battery based on the SoC information of the battery to the terminal 300.

The server compares the determined charge level of the battery and the reference level, if the charge level is equal to or less than the reference level in 256, determines whether there is information about battery discharge stored before the vehicle turns on the ignition, in 257, if it is determined that there is the stored information about battery discharge, blocks sending of the information about battery discharge to the terminal, and deletes the stored information about battery discharge, in 258.

On the other hand, if it is determined that there is no stored information about battery discharge, the server sends notification information about battery discharge to the terminal 300, in 259.

In this way, after the vehicle turns off the ignition, the server may lead the user through the terminal 300 to drive the vehicle to fully charge the battery.

As shown in FIG. 10, the server charges the battery from the point S1 at which the ignition is turned on. Accordingly, the charge amount of the battery of the vehicle increases, and the charge level increases as well.

When the vehicle turns off the ignition at the point S2, the server controls sending of the information about battery discharge to the terminal based on the discharge level at the point at which the ignition is turned off and whether there is the stored discharge information.

As shown in FIG. 10, on assumption that the vehicle turns off the ignition at the point S2, the server determines a charge level corresponding to the SoC information of the battery sent from the vehicle, if it is determined that the charge level is equal to or less than the reference level, determines whether there is information about battery discharge stored before the point S1 at which the ignition is turned on, if it is determined that there is no information about battery discharge stored before the point S1 at which the ignition is turned on, sends information about battery discharge to the terminal, and if it is determined that there is information about battery discharge stored before the point S1 at which the ignition is turned on, does not send information about battery discharge to the terminal.

As shown in FIG. 10, on assumption that the vehicle turns off the ignition at point S3, the server determines a charge level corresponding to SoC information of the battery sent from the vehicle, and if it is determined that the charge level is equal to or greater than the reference level, does not send information about battery discharge to the terminal.

The server changes the reference level based on a surrounding condition, sends the changed reference level to the vehicle, and the vehicle may monitor the battery based on the changed reference level from a point at which the vehicle turns on the ignition. This will be described in connection with FIGS. 11 to 13.

Figure 11:
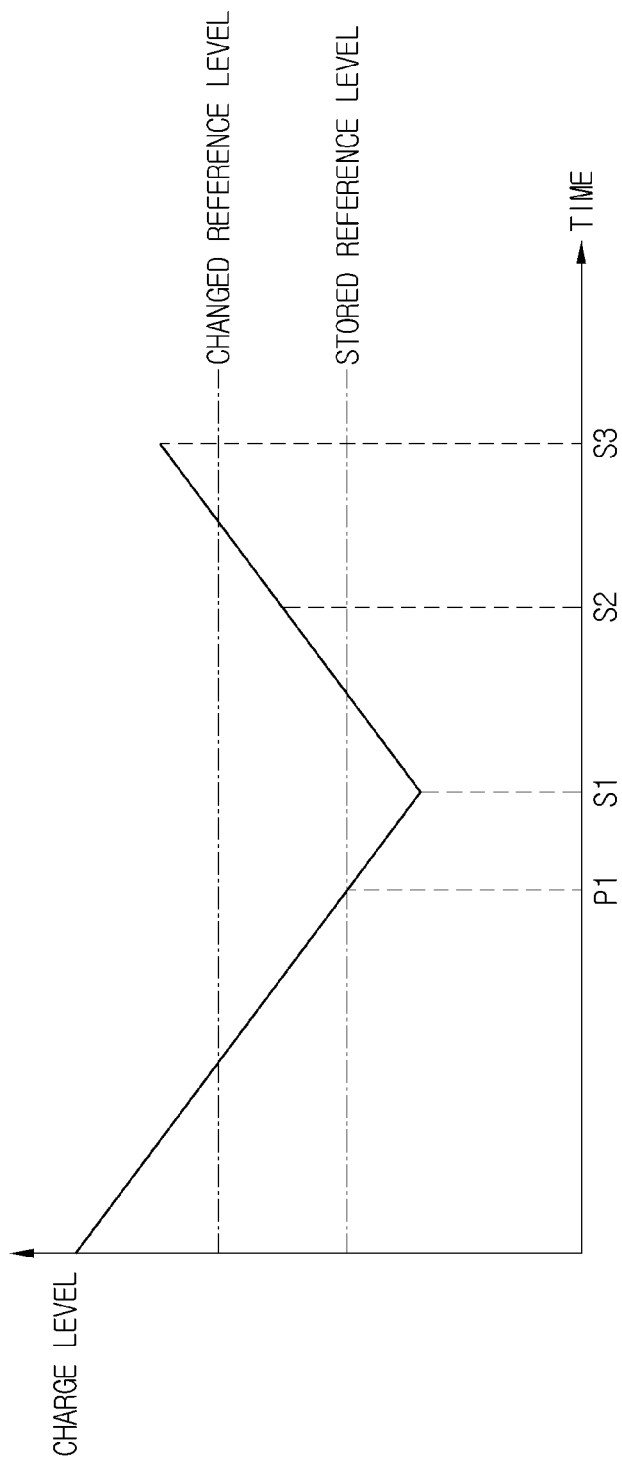

FIG. 11 shows sending of notification information from a server if a changed reference level is higher than a stored reference level, illustrating when the ignition is turned on while a charge level of the battery of a vehicle is lower than the stored reference level.

Referring to FIG. 11, the vehicle controls information about battery discharge to be sent based on a reference level stored in the storage medium 161.

The vehicle sends the information about battery discharge to the server according to a trigger signal generated at the point P1 at which the charge level of the battery is equal to the stored reference level. Upon reception of the information about battery discharge from the vehicle, the server may send notification information about battery discharge to the terminal.

The vehicle changes the reference level stored in the storage medium 161 to the received reference level at the point S1 at which the ignition is turned on, and when the ignition is turned off, sends SoC information of the battery to the server.

The server may obtain a charge level of the battery based on the SoC information of the battery of the point at which the ignition is turned off, and control notification information about battery discharge to be sent based on the obtained charge level and the changed reference level.

Referring to FIG. 11, when the vehicle turns off the ignition at S2, the vehicle sends SoC information of the battery of the point S2 to the server.

The server obtains a charge level of the battery of the point S2, compares the obtained charge level and the changed reference level, if it is determined that the obtained charge level is lower than the changed reference level, determines whether there is information about battery discharge stored before the point S1 at which the ignition is turned on, if it is determined that there is no stored information about battery discharge, sends notification information about battery discharge to the terminal, and if it is determined that there is stored information about battery discharge, does not send the notification information about battery discharge to the terminal.

As shown in FIG. 11, when the vehicle turns off the ignition at S3, the vehicle sends SoC information of the battery of the point S3 to the server. The server obtains a charge level of the battery of the point S3, compares the obtained charge level and the changed reference level, and if it is determined that the obtained charge level is higher than the changed reference level, does not send the notification information about battery discharge to the terminal.

Figure 12:
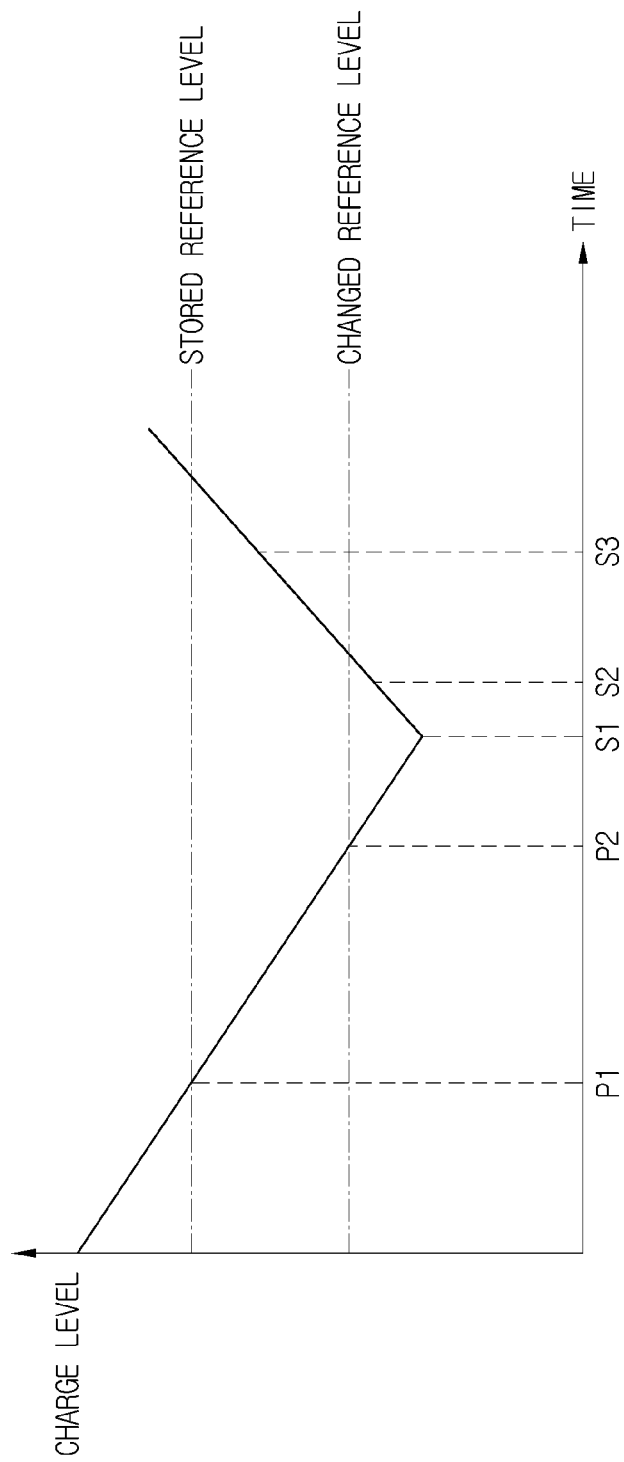

FIG. 12 shows sending of notification information from a server if a changed reference level is lower than a stored reference level, illustrating when the ignition is turned on after a charge level of the battery of a vehicle is lower than the stored reference level and the changed reference level.

Referring to FIG. 12, the vehicle controls information about battery discharge to be sent based on a reference level stored in the storage medium 161.

The vehicle sends the information about battery discharge to the server according to a trigger signal generated at the point P1 at which the charge level of the battery is equal to the stored reference level. Upon reception of the information about battery discharge from the vehicle, the server may send notification information about battery discharge to the terminal.

Since the vehicle does not change the stored reference level before turning on the ignition, it does not generate a trigger signal nor send the information about battery discharge to the server even if the charge level of the battery is equal to the changed reference level at the point P2 before the ignition is turned on.

The vehicle changes the reference level stored in the storage medium 161 to the received reference level at the point S1 at which the ignition is turned on, and when the ignition is turned off, sends SoC information of the battery to the server.

The server may obtain a charge level of the battery based on the SoC information of the battery of the point at which the ignition is turned off, and control notification information about battery discharge to be sent based on the obtained charge level and the changed reference level.

Referring to FIG. 12, when the vehicle turns off the ignition at S2, the vehicle sends SoC information of the battery of the point S2 to the server.

The server obtains a charge level of the battery of the point S2, compares the obtained charge level and the changed reference level, if it is determined that the obtained charge level is lower than the changed reference level, determines whether there is information about battery discharge stored before the point S1 at which the ignition is turned on, if it is determined that there is no stored information about battery discharge, sends notification information about battery discharge to the terminal, and if it is determined that there is stored information about battery discharge, does not send the notification information about battery discharge to the terminal.

As shown in FIG. 12, when the vehicle turns off the ignition at S3, the vehicle sends SoC information of the battery of the point S3 to the server. The server obtains a charge level of the battery of the point S3, compares the obtained charge level and the changed reference level, and if it is determined that the obtained charge level is higher than the changed reference level, does not send the notification information about battery discharge to the terminal.

Figure 13:
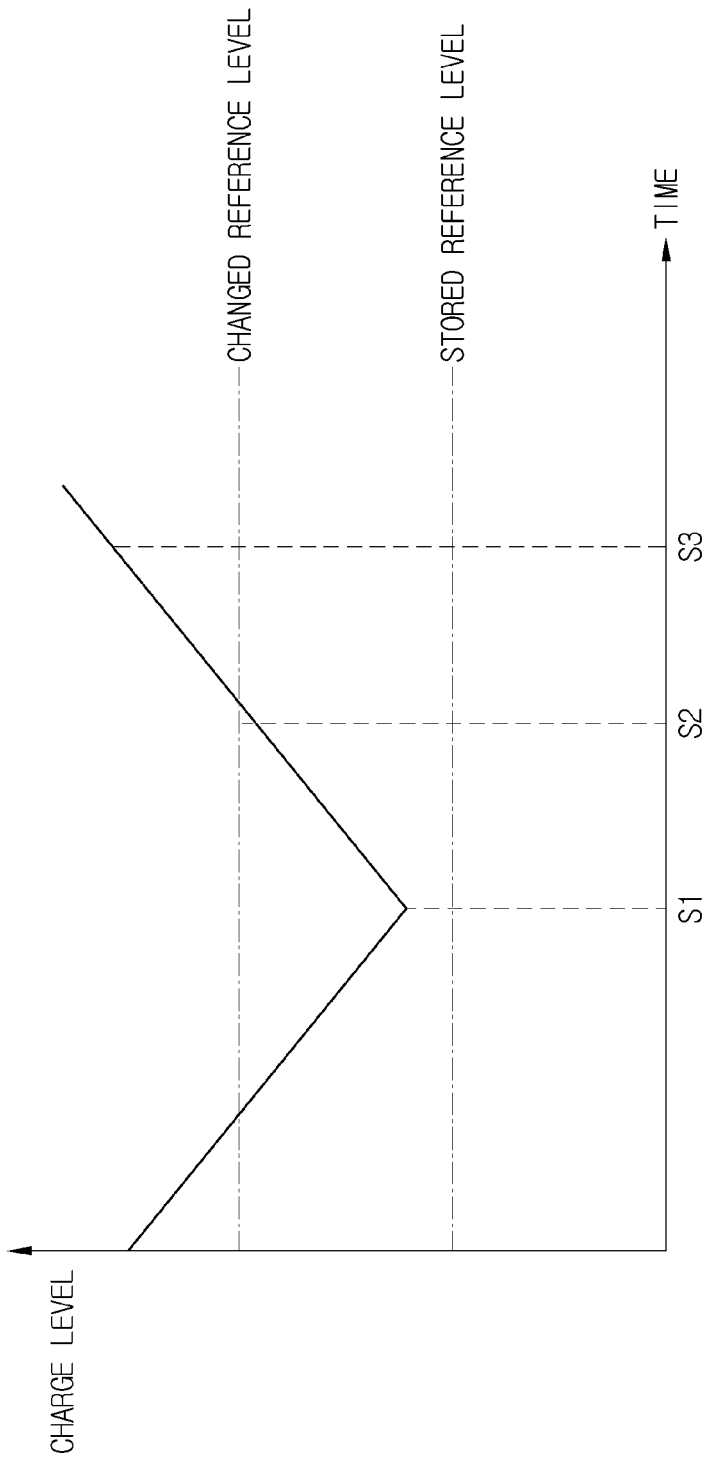

FIG. 13 shows sending of notification information from a server if a changed reference level is higher than a stored reference level, illustrating when the ignition is turned on while a charge level of the battery of a vehicle is higher than the stored reference level.

Referring to FIG. 13, the vehicle controls information about battery discharge to be sent based on a reference level stored in the storage medium 161. Since the trigger signal is not generated if the charge level of the battery is higher than the stored reference level, the vehicle does not send the notification information about battery charge to the server.

When the vehicle turns on the ignition while the charge level of the battery is higher than the stored reference level, the vehicle changes the reference level stored in the storage medium 161 to the received reference level at the point S1 at which the ignition is turned on.

The vehicle charges the battery while being driven, and accordingly, the charging level of the battery increases.

When the vehicle turns off the ignition, it sends SoC information of the battery to the server at the point when the ignition is turned off. The server may obtain a charge level of the battery based on the SoC information of the battery of the point at which the vehicle turns off the ignition, and control notification information about battery discharge to be sent based on the obtained charge level and the changed reference level.

Referring to FIG. 13, when the vehicle turns off the ignition at S2, the vehicle sends SoC information of the battery of the point S2 to the server.

The server obtains a charge level of the battery of the point S2, compares the obtained charge level and the changed reference level, if it is determined that the obtained charge level is lower than the changed reference level, determines whether there is information about battery discharge stored before the point S1 at which the ignition is turned on, if it is determined that there is no stored information about battery discharge, sends notification information about battery discharge to the terminal.

In other words, since there is no history of having received information about battery discharge from the vehicle, there is no stored information about battery discharge.

As shown in FIG. 13, when the vehicle turns off the ignition at S3, the vehicle sends SoC information of the battery of the point S3 to the server. The server obtains a charge level of the battery of the point S3, compares the obtained charge level and the changed reference level, and if it is determined that the obtained charge level is higher than the changed reference level, does not send the notification information about battery discharge to the terminal. At this time, the server may send a charge amount of the battery of the vehicle to the terminal.

Figure 14:
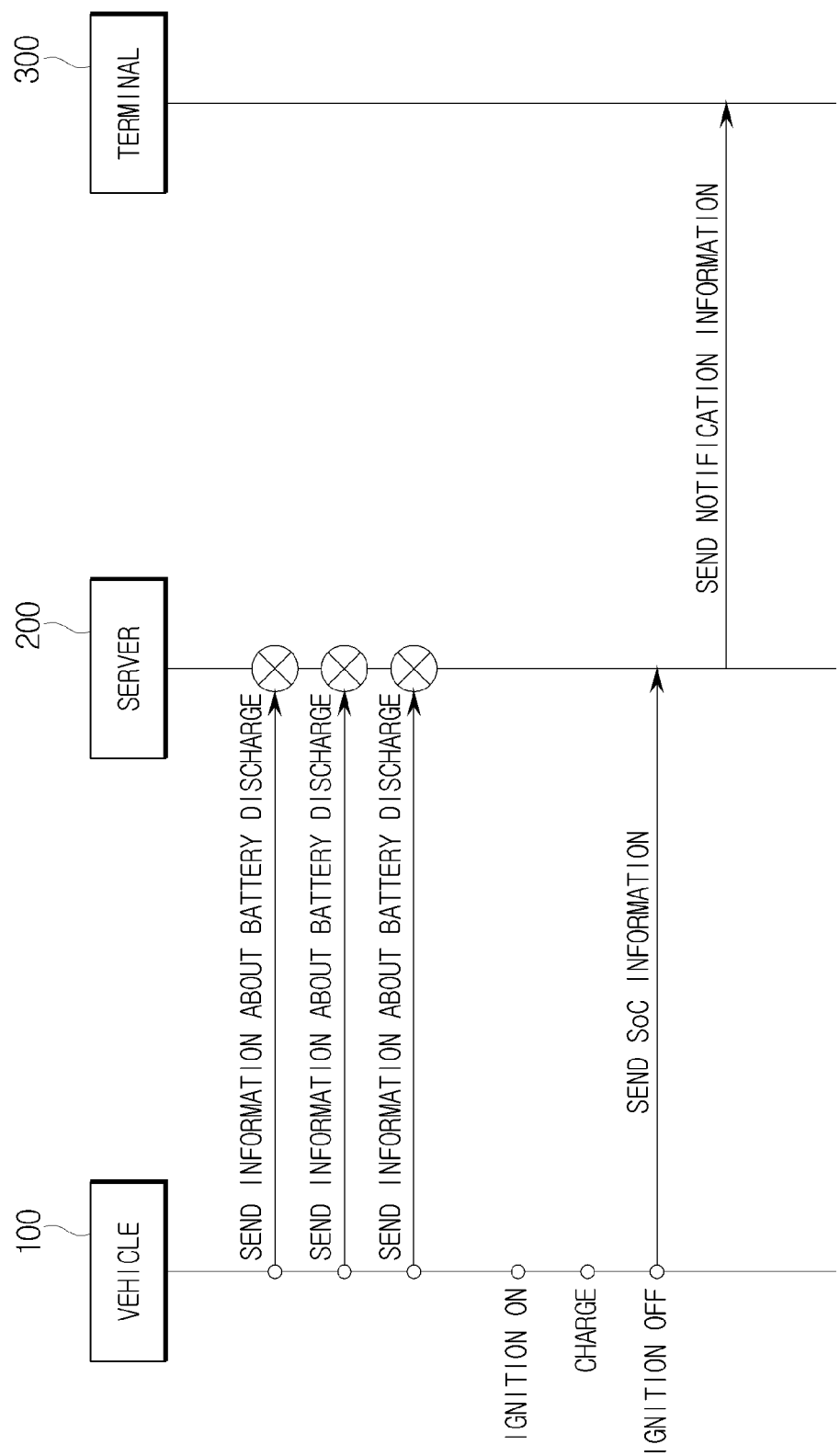
FIGS. 14 and 15 illustrate communication between a vehicle, a server, and a terminal, according to an embodiment of the present disclosure.
Figure 15:
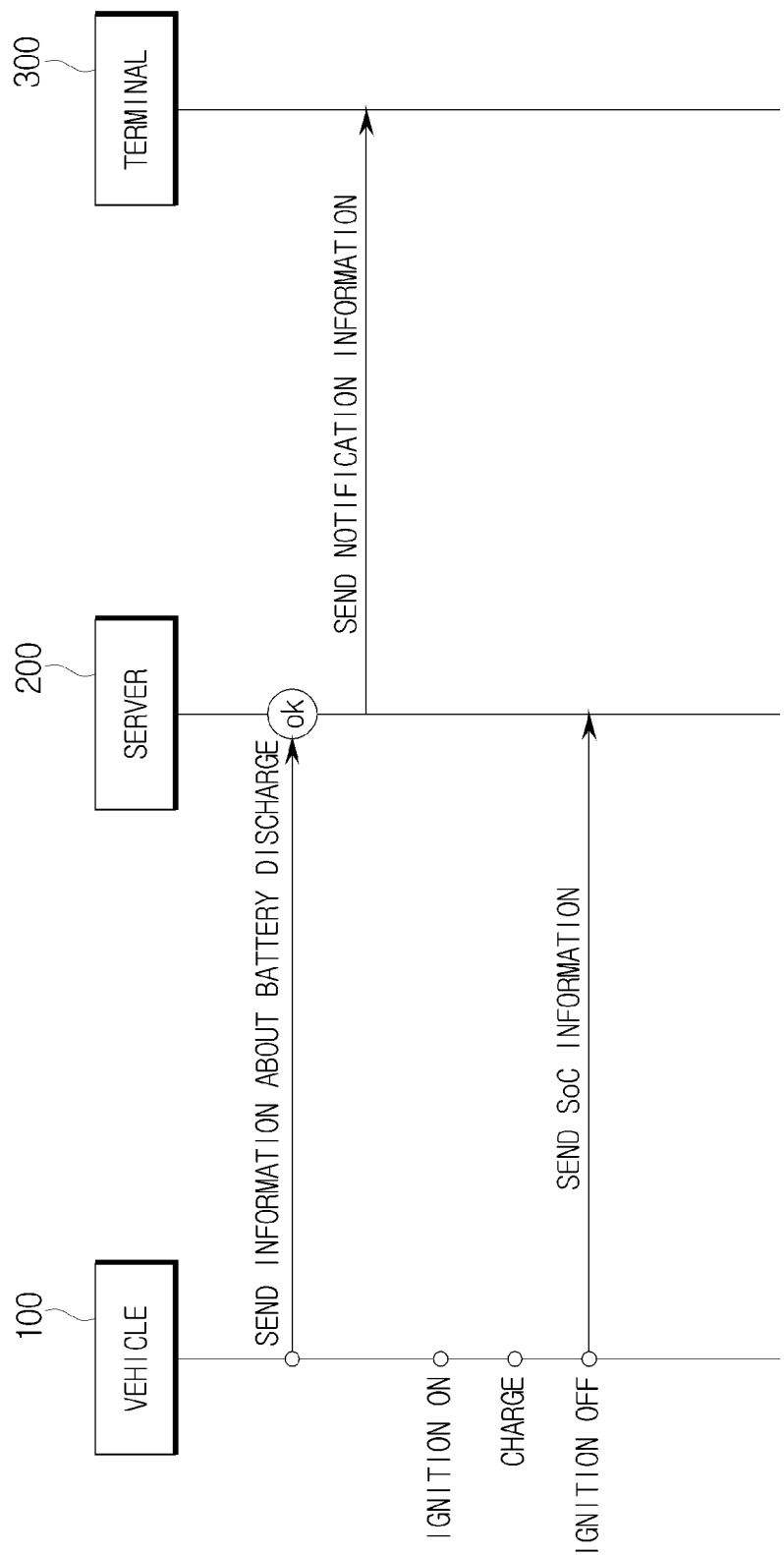

FIGS. 14 and 15 illustrate information sent between a vehicle, a server, and a terminal, according to an embodiment of the present disclosure.

Referring to FIG. 14, if a charge level of the battery is the reference level while the vehicle 100 is turned off, the vehicle 100 sends information about battery discharge to the server 200 for the first time.

If it is determined that the information about battery discharge has not been sent, the vehicle 100 sends the information about battery discharge to the server 200 for the second time after the lapse of a certain time.

If it is determined that the information about battery discharge has not been sent, the vehicle 100 sends the information about battery discharge to the server 200 for the third time after the lapse of a certain time and enters into a sleep state.

When a command to turn on the ignition is received and driving is performed, the vehicle 100 charges the battery, and when a command to turn off the ignition is received, the vehicle 100 checks the SoC of the battery and sends the SoC information to the server 200.

If the server 200 is unavailable for communication with the vehicle 100, it may not receive the information about battery discharge.

If receiving the ignition-off signal and the SoC information of the battery from the vehicle 100 while the server 200 is available for communication with the vehicle 100, the server 200 determines a charge level of the battery corresponding to the received SoC information of the battery.

The controller 200 may send the charge amount of the battery to the terminal if the determined charge level of the battery exceeds the reference level.

On the other hand, if the determined charge level of the battery is equal to or less than the reference level, the server 200 determines whether the information about battery discharge has been received before the ignition-on signal is received from the vehicle, and if it is determined that the information about battery discharge has not been received before the ignition-on signal is received from the vehicle, sends the notification information about battery discharge to the terminal 300.

Upon reception of the notification information, the terminal 300 may display information about caution of battery discharge of the vehicle, prompting the user to prevent the battery from being discharged. For example, the terminal 300 may request the user to drive the vehicle for more than a predetermined time.

Referring to FIG. 15, if a charge level of the battery is the reference level while the vehicle 100 is turned off, the vehicle 100 sends information about battery discharge to the server 200 for the first time.

If it is determined that the information about battery discharge has been sent, the vehicle 100 does not send the information about battery discharge to the server 200 any longer.

The server 200 sends notification information about battery discharge to the terminal 300 if the information about battery discharge is received.

Upon reception of the notification information, the terminal 300 may display information about caution of battery discharge of the vehicle, prompting the user to prevent the battery from being discharged. For example, the terminal 300 may request the user to drive the vehicle for more than a predetermined travel time.

When a command to turn on the ignition is received and driving is performed, the vehicle 100 charges the battery, and when a command to turn off the ignition is received, the vehicle 100 checks the SoC of the battery and sends the SoC information to the server 200.

If receiving the ignition-off signal and the SoC information of the battery from the vehicle 100 while the server 200 is available for communication with the vehicle 100, the server 200 determines a charge level of the battery corresponding to the received SoC information of the battery, and if the determined charge level of the battery is equal to or less than the reference level, determines whether information about battery discharge has been received before the ignition-on signal of the vehicle is received.

If it is determined that the information about battery discharge has been received before the ignition-on signal of the vehicle is received, the server 200 determines that notification information about battery discharge was sent to the terminal 300 before the ignition-on signal is received from the vehicle, and thus, does not send the notification information about battery discharge again to the terminal 300.

In other words, the server 200 may determine that the user recognized the notification information about caution of battery discharge through the terminal 300 and has driven the vehicle for more than a predetermined travel time in response to the notification information.

The server 200 may estimate a charge amount of the battery based on the information about a driving state of the vehicle while the vehicle is driven, and may send the estimated charge amount of the battery to the terminal 300.

The server 200 may also obtain a charge amount of the battery based on the SoC information of the battery while the vehicle is turned off.

The terminal 300 may display the charge amount of the battery from driving of the vehicle, which is sent from the server 200 while the vehicle is being driven and turns off the ignition.

In the embodiment of the present disclosure, the server may determine whether there is history of having received and stored information about battery discharge when a charge level of the battery corresponding to the SoC of the battery is less than the reference level, send notification information about the battery to the terminal if it is determined that there is no history of having received and stored information about battery discharge, or may not send notification information about the battery to the terminal if it is determined that there is the history of having received and stored information about battery discharge.

Figure 16:
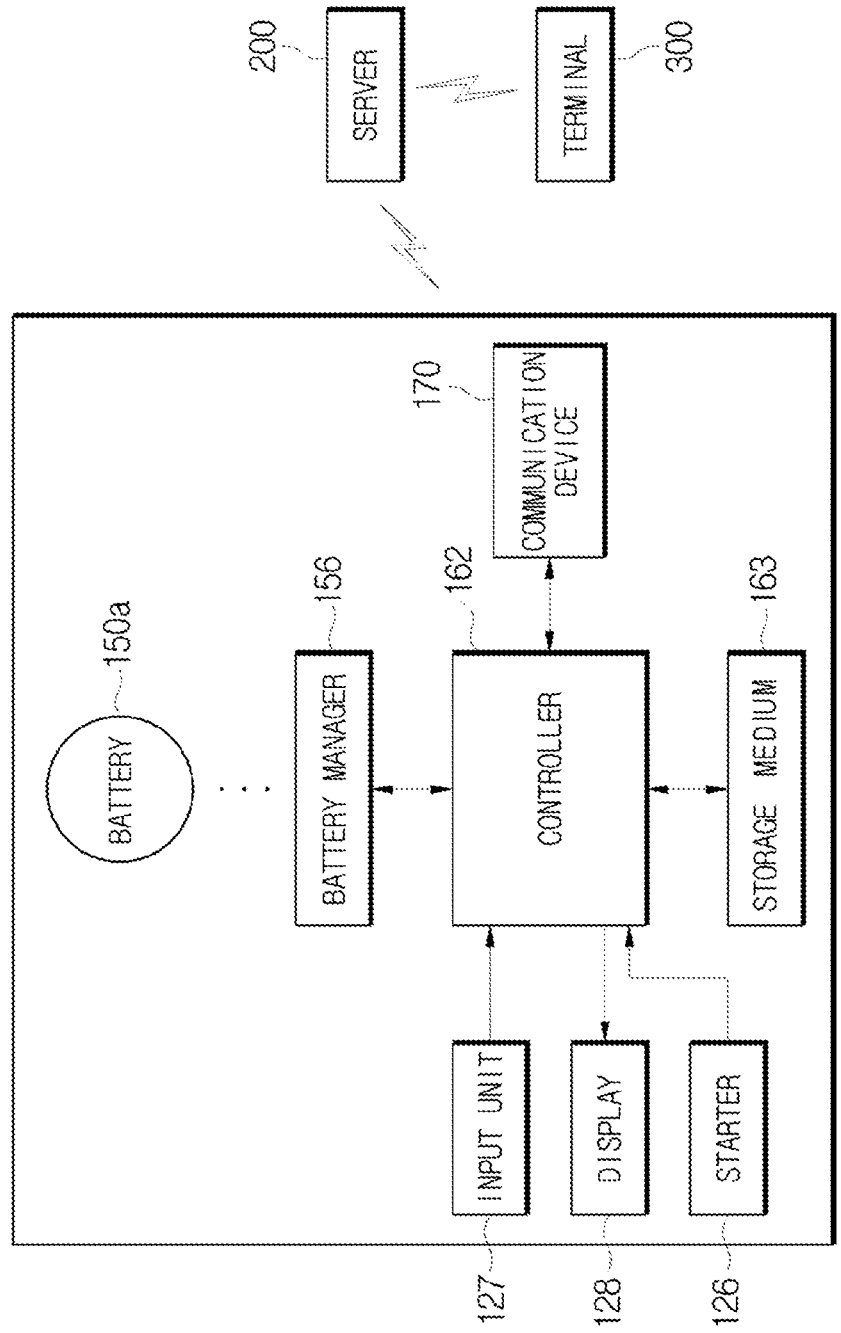
FIG. 16 is a control block diagram of a vehicle and a server, according to another embodiment of the present disclosure.

FIG. 16 is a control block diagram of a vehicle and a server, according to another embodiment of the present disclosure, which will be described in connection with FIG. 17.

Figure 17:
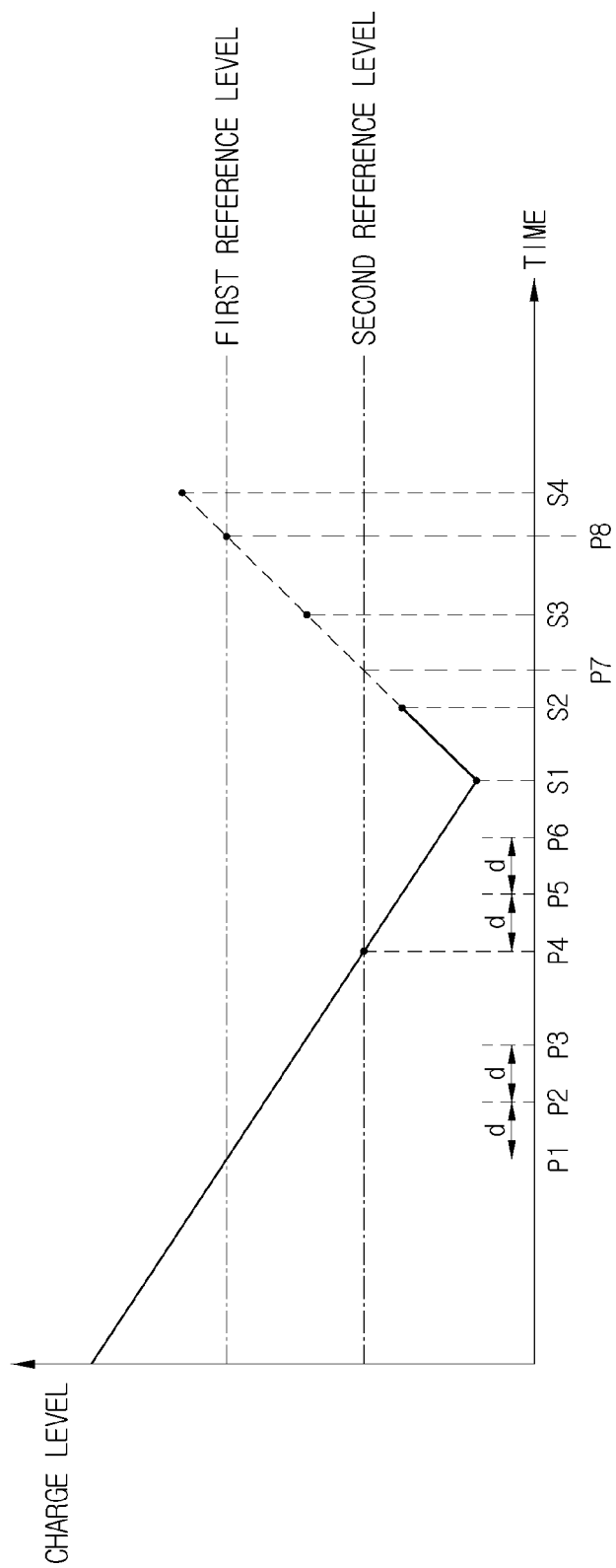
FIG. 17 illustrates information about battery discharge and SoC information of a battery of a vehicle to be sent, according to another embodiment of the present disclosure.

FIG. 17 illustrate discharge information and SoC information of a battery of a vehicle to be sent, according to another embodiment of the present disclosure.

A vehicle in accordance with another embodiment of the present disclosure includes the starter 126, the input unit 127, the display 128, a battery manager 156, a controller 162, a storage medium 163, and the communication device 170.

In this embodiment, the starter 126, input unit 127, display 128, and communication device 170 are the same as what are shown in the previous embodiment, so the description of them will be omitted.

The battery manager 156 stores a charge level corresponding to a current of the battery and stores first and second reference levels.

The first reference level is a level indicating caution of battery discharge. The second reference level is a level indicating a danger of battery discharge, which has a lower value than the first reference level.

The battery manager 156 may generate a first trigger signal if the charge level of the battery is the first reference level, and generates a second trigger signal if the charge level of the battery is the second reference level.

The trigger signals when the charge level of the battery corresponds to the first and second reference levels may be the same.

Alternatively, the trigger signals when the charge level of the battery corresponds to the first and second reference levels may be different.

The battery manager 156 may monitor the state of charge of the battery, send the SoC information about the monitored state of charge to the controller 160, determine a charge level corresponding to the SoC of the battery, and generate a trigger signal if the charge level corresponds to the first reference level or the second reference level.

The trigger signal may be a signal to wake up the controller 162 when notification information for preventing discharge of the battery 150*a* is sent.

Upon reception of a new first reference level, the battery manager 156 may change the first reference level stored in advance to the received first reference level and generate a trigger signal based on the changed first reference level.

Upon reception of a new first reference level, the battery manager 156 may change the first reference level stored in advance to the received first reference level and generate a trigger signal based on the changed first reference level.

The battery manager 156 may include the current detector 151, the voltage detector 152, the temperature detector 153, the monitoring device 154, and the output unit 155. The components of the battery manager 156 are the same as what are described above, so the description thereof will be omitted.

The battery manager 156 may check the SoC of the battery based on a control instruction from the controller 160 and output the SoC information to the controller 162.

The battery manager 156 prevents the lifespan of the battery from being reduced by preventing the battery from being charged to more than the maximum charge amount.

The battery manager 156 may include the current detector, the voltage detector, the temperature detector, the monitoring device, and the output unit.

In another embodiment, the monitoring device may generate a first trigger signal if the charge level of the battery is the first reference level, and generate a second trigger signal if the charge level of the battery is the second reference level.

When the first trigger signal is generated by the monitoring device, the output unit may send the first trigger signal to the controller 162, and when the second trigger signal is generated by the monitoring device, the output unit may send the second trigger signal to the controller 162.

The output unit sends the SoC information of the battery monitored by the monitoring device to the controller 162.

The SoC information of the battery may be information about a charge amount of the battery. The SoC information may also be a charge level of the battery.

Other configurations of the current detector, voltage detector, temperature detector, monitoring device, and the output unit of the battery manager are the same as those in the previous embodiment, so the description will be omitted.

The controller 162 communicates with the battery manager 156.

The controller 162 may be woken up upon reception of a trigger signal while the vehicle is turned off.

The controller 162 receives SoC information from the battery manager 156. The SoC information of the battery may include a charge amount of the battery.

The controller 162 may control the communication device 170 to communicate with the server 200.

The controller 162 sends information about battery discharge to the server 200 upon reception of a trigger signal from the battery manager 156 while the vehicle is parked, i.e., the vehicle is turned off.

The information about battery discharge is information indicating that the battery is discharged to a reference level, which may be information requesting the user to charge the battery.

The information about battery discharge may include information about caution of discharge corresponding to the first reference level and information about danger of discharge corresponding to the second reference level.

The controller 162 is woken up upon reception of the first trigger signal, sends the information about caution of discharge to the server 200, enters into a sleep state after completion of sending the information about caution of discharge, is woken up upon reception of the second trigger signal, sends the information about danger of discharge to the server 200, enters into the sleep state after completion of sending the information about danger of discharge If the controller 162 determines that communication with the server 200 is unavailable in sending the information about battery discharge, the controller 160 sends the information about battery discharge again to the server 200.

In this regard, if the controller 162 determines that communication with the server 200 is unavailable in sending the information about battery discharge, the controller 160 may send the information about battery discharge as many times as the number of times set in advance.

The controller 162 is woken up upon reception of one of the first and second trigger signals, and enters into the sleep state after it sends the information about battery discharge as many times as the number of times set in advance.

Upon reception of a command to turn off the ignition, the controller 162 receives the SoC information of the battery from the battery manager 156 and controls the communication device 170 to send the SoC information to the server 200.

Upon reception of the first or second reference level of the battery from the server 200, the controller 162 changes the first or second reference level of the battery stored in the storage medium 163 to the received first or second reference level of the battery and controls the storage medium 161 to store the changed reference level.

Upon reception of the command to turn on the ignition, the controller 162 determines whether the first or second reference level of the battery is changed and if it is determined that the first or second reference level of the battery is changed, sends the changed reference level of the battery to the battery manager 156.

Upon reception of the first or second reference level of the battery from the server 200, the controller 162 changes the first or second reference level of the battery stored in the storage medium 161 to the received first or second reference level of the battery and controls the storage medium 161 to store the changed reference level.

Upon reception of the command to turn on the ignition, the controller 162 determines whether the first or second reference level of the battery is changed and if it is determined that the first or second reference level of the battery is changed, sends the changed first or second reference level of the battery to the battery manager 156.

The controller 162 may be implemented with a memory (not shown) storing an algorithm to control operation of the components in the vehicle 100 or data about a program that implements the algorithm, and a processor (not shown) carrying out the aforementioned operation using the data stored in the memory. The memory and the processor may be implemented in separate chips. Alternatively, the memory and the processor may be implemented in a single chip.

The storage medium 163 may store the first and second reference levels of a battery.

The storage medium 163 may store a certain interval at which the information about battery discharge is sent.

The storage medium 163 may be a memory implemented with a chip separate from the aforementioned processor in relation to the controller 162, or may be implemented integrally with the processor in a single chip.

Upon reception of at least one of the information about caution of discharge and information about danger of discharge from the vehicle, the server stores the received at least one information and sends notification information about the received at least one information to the terminal.

If receiving the ignition-off signal and the SoC information of the battery from the vehicle 100 while the server 200 is available for communication with the vehicle 100, the server 200 determines a charge level of the battery corresponding to the received SoC information of the battery, and if the determined charge level of the battery is equal to or less than the first or second reference level, determines whether there is history of having received at least one of the information about caution of discharge and information about danger of discharge of the battery before the ignition-on signal of the vehicle is received.

If it is determined that there is the history of having received at least one of the information about caution of discharge and information about danger of discharge of the battery before the ignition-on signal of the vehicle is received, the server 200 does not send the notification information about battery discharge to the terminal any longer, or if it is determined that there is no history of having received at least one of the information about caution of discharge and information about danger of discharge of the battery, the server 200 sends the notification information about battery discharge to the terminal.

In other words, the server 200 may determine that the user recognized the notification information about caution of battery discharge or danger of battery discharge through the terminal 300 and has driven the vehicle for more than a predetermined travel time in response to the notification information.

The server 200 may estimate a charge amount of the battery based on the information about a driving state of the vehicle while the vehicle is driven, and may send the estimated charge amount of the battery to the terminal 300.

Referring to FIG. 17, the vehicle sends information about caution of battery discharge at the point P1 at which the charge level of the battery is equal to the first reference level while the vehicle is turned off, sends information about caution of battery discharge again at the point P2 after the lapse of a certain period of time d if the communication with the server is unavailable, and sends the information about caution of battery discharge at the point P3 after the lapse of the certain period of time d if the communication with the server continues to be unavailable.

The vehicle sends information about danger of battery discharge at the point P4 at which the charge level of the battery is equal to the second reference level while the vehicle is turned off, sends information about danger of battery discharge again at the point P5 after the lapse of a certain period of time d if the communication with the server is unavailable, and sends the information about danger of battery discharge at the point P6 after the lapse of the certain period of time d if the communication with the server continues to be unavailable.

When the vehicle turns on the ignition and starts driving, the vehicle charges the battery with the power produced while the vehicle is driven. The charge amount of the battery then increases, and accordingly, the charge level increases as well.

The vehicle stops charging the battery when receiving the command to turn off the ignition, checks the SoC of the battery that stops being charged, and sends the SoC information of the battery to the server.

It is also possible for the vehicle to send a charge level of the battery corresponding to the SoC of the battery to the server upon reception of the command to turn off the ignition.

The server may obtain a charge level of the battery based on the SoC information of the battery of the point at which the ignition is turned off, and control notification information about battery discharge to be sent by comparing the obtained charge level and each of the first and second reference levels.

Referring to FIG. 17, when the vehicle turns off the ignition at S2, the vehicle sends SoC information of the battery of the point S2 to the server.

The server obtains the charge level of the battery based on the SoC of the battery of the point S2 and compares the obtained charge level with each of the first and second reference levels.

If determining that the obtained charge level is lower than the first or second reference level, the server checks the history of having received at least one of the information about caution of battery discharge and information about danger of battery discharge, which is stored before the point S1 at which the ignition is turned on, if it is determined that no history of having received the information is stored, sends notification information about battery discharge to the terminal, and if it is determined that the history of having received the information is stored, does not send the notification information about battery discharge to the terminal.

As shown in FIG. 17, when the vehicle turns off the ignition at S3, the vehicle sends SoC information of the battery of the point S3 to the server.

The server obtains the charge level of the battery based on the SoC of the battery of the point S3 and compares the obtained charge level with each of the first and second reference levels.

If determining that the obtained charge level is lower than the first reference level and higher than the second reference level, the server checks the history of having received at least one of the information about caution of battery discharge and information about danger of battery discharge, which is stored before the point S1 at which the ignition is turned on, if it is determined that no history of having received the information is stored, sends notification information about battery discharge to the terminal, and if it is determined that the history of having received the information is stored, does not send the notification information about battery discharge to the terminal.

As shown in FIG. 17, when the vehicle turns off the ignition at S4, the vehicle sends SoC information of the battery of the point S4 to the server.

The server obtains the charge level of the battery based on the SoC of the battery of the point S4 and compares the obtained charge level with each of the first and second reference levels.

If determining that the obtained charge level is higher than the first and second reference levels, the server does not send notification information about battery discharge to the terminal.

Battery monitoring of the vehicle and sending of the notification information of the server in a case that the vehicle turns off the ignition at the point S3 will now be briefly described.

While the vehicle is turned on and charging the battery, the vehicle may obtain a charge level of the battery based on the SoC information of the battery, send information about danger of battery discharge to the server based on a trigger signal generated at point P7 at which the obtained charge level is equal to the second reference level, and when the ignition is turned off, send an ignition-off signal and SoC information of the battery to the server at the point S3 at which the ignition is turned off.

Upon reception of the information about danger of battery discharge while the vehicle is turned on and driven, the server may send information notifying that the battery is out of danger of being discharged to the terminal.

Battery monitoring of the vehicle and sending of the notification information of the server in a case that the vehicle turns off the ignition at the point S4 will now be briefly described.

While the vehicle is turned on and charging the battery, the vehicle may obtain a charge level of the battery based on the SoC information of the battery, send information about danger of battery discharge to the server based on a trigger signal generated at point P7 at which the obtained charge level is equal to the second reference level, send information about caution of battery discharge to the server based on a trigger signal generated at point P8 at which the obtained charge level is equal to the first reference level, and when the ignition is turned off, send an ignition-off signal and SoC information of the battery to the server at the point S4 at which the ignition is turned off.

Upon reception of the information about danger of battery discharge while the vehicle is turned on and driven, the server may send information notifying that the battery is out of danger of being discharged to the terminal, and upon reception of the information about caution of battery discharge, the server may send information notifying that the battery is out of the cautionary situation of being discharged to the terminal.

According to an embodiment of the present disclosure, information about battery discharge may be output through a terminal for user while a vehicle is parked, so that the user may easily recognize information about battery discharge of the parked vehicle anytime anyplace.

According to an embodiment of the present disclosure, whether to send notification information about a battery may be determined based on whether SoC information and information about battery discharge are received when the vehicle is turned off, so that excessively frequent transmission of the notification information about the battery to the terminal for user may be prevented.

According to an embodiment of the present disclosure, notification information about a battery may be output through a terminal for user when the vehicle is turned off, leading the user to fully charge the battery before parking the vehicle. This may extend the battery's lifespan and use the vehicle conveniently next time.

According to an embodiment of the present disclosure, the battery of a vehicle may be efficiently managed to fit for a surrounding condition by changing a reference level to send information about battery discharge based on a surrounding condition, such as weather and temperature.

As such, the embodiments of the present disclosure may improve the quality and commercial value of a server capable of providing information and a vehicle communicating with the server, and further increase user satisfaction and reliability and safety of the vehicle, thereby securing competitiveness of the product.

Several embodiments have been described above, but a person of ordinary skill in the art will understand and appreciate that various modifications can be made without departing the scope of the present disclosure. Thus, it will be apparent to those ordinary skilled in the art that the true scope of technical protection is only defined by the following claims.

What is claimed is:

1. A vehicle comprising:
   a communication device configured to communicate with a server;
   a battery configured to supply power to an electronic device;
   a battery manager configured to monitor a state of charge (SoC) of the battery and to generate a trigger signal based on the SoC of the battery, wherein the battery manager comprises a current detector configured to detect a current of the battery and a monitoring device configured to obtain a charge level corresponding to the detected current and to generate the trigger signal when the obtained charge level is a reference level; and
   a controller configured to control the communication device to send information about battery discharge to the server upon reception of the trigger signal, to determine whether or not the information about battery discharge is sent in response to determining whether a response signal indicating reception of the information about battery discharge is received from the server, and to control the information about battery discharge to be sent again if it is determined that the information about battery discharge is not sent;
   wherein the controller is configured to receive, from the server, an instruction to change a stored reference level to an obtained reference level and to change the stored reference level to the obtained reference level; and
   wherein the monitoring device is configured to generate the trigger signal based on the changed reference level.

2. The vehicle of claim 1, further comprising a starter configured to receive a command to turn on an ignition, wherein the monitoring device is configured to generate the trigger signal based on the stored reference level until the command to turn on the ignition is received and to generate the trigger signal based on the obtained reference level upon reception of the command to turn on the ignition.

3. The vehicle of claim 1, further comprising a starter configured to receive a command to turn on an ignition and a command to turn off the ignition, wherein the controller is configured to, upon reception of the command to turn off the ignition after receiving the command to turn on the ignition, control the communication device to send SoC information of the battery to the server.

4. The vehicle of claim 1, wherein the controller is configured to send the information about battery discharge as many times as a predetermined number of times when communication with the communication device is unavailable.

5. The vehicle of claim 4, wherein the controller is configured to be woken up upon reception of the trigger signal, and to enter a sleep state after sending the information about battery discharge as many times as the predetermined number of times.

6. A vehicle comprising:
   a communication device configured to communicate with a server;
   a battery configured to supply power to an electronic device;
   a battery manager configured to monitor a state of charge (SoC) of the battery and to generate a trigger signal based on the SoC of the battery; and
   a controller configured to control the communication device to send information about battery discharge to the server upon reception of the trigger signal, to determine whether or not the information about battery discharge is sent in response to determining whether a response signal indicating reception of the information about battery discharge is received from the server, and to control the information about battery discharge to be sent again if it is determined that the information about battery discharge is not sent,
   wherein the battery manager comprises:
      a current detector configured to detect a current of the battery; and
      a monitoring device configured to obtain a charge level corresponding to the detected current, to generate a first trigger signal when the obtained charge level is equal to a first reference level, and to generate a second trigger signal when the obtained charge level is equal to a second reference level, wherein the second reference level is lower than the first reference level.

7. The vehicle of claim 6, wherein the controller is configured to be woken up upon reception of the first trigger signal, to control the communication device to send information about caution of battery discharge as many times as a predetermined number of times, to be woken up upon reception of the second trigger signal, to control the communication device to send information about danger of battery discharge as many times as a predetermined number of times, and to enter to a sleep state after sending at least one of the information about caution of battery discharge and the information about danger of battery discharge as many times as a predetermined number of times.

8. A server comprising:
   a storage medium;
   a communication device configured to communicate with a vehicle and a terminal; and
   a controller configured, upon reception of information about battery discharge from the vehicle, to:
      control the storage medium to store the received information about battery discharge;
      control the communication device to send notification information about battery discharge to the terminal;
   wherein the controller is configured to check whether the information about battery discharge is stored in the storage medium upon reception of an ignition-off signal and information about a state of charge (SoC) of the battery from the vehicle, and to control the communication device to send notification information about battery discharge to the terminal if the information about battery discharge is not stored in the storage medium; and
   wherein the storage medium is configured to store the information about battery discharge as a battery discharge history corresponding to a control command of the controller.

9. The server of claim 8, wherein the controller is configured to, upon reception of an ignition-on signal and SoC information of the battery from the vehicle, determine a charge amount of the battery corresponding to the received SoC information, and control the communication device to send the determined charge amount of the battery to the terminal.

10. The server of claim 8, wherein the controller is configured to determine a charge level corresponding to the SoC information of the battery, and control the communication device to send notification information about battery discharge when the determined charge level is equal to or less than a reference level and the information about battery discharge is not stored in the storage medium.

11. The server of claim 10, wherein the controller is configured to control sending of the notification information about battery discharge to be blocked when the determined charge level is equal to or less than the reference level and the information about battery discharge is stored in the storage medium.

12. The server of claim 8, wherein the controller is configured to check whether the information about battery discharge is stored in the storage medium before an ignition-on signal is received from the vehicle.

13. The server of claim 8, wherein the controller is configured to receive surrounding information of the vehicle, determine a reference level corresponding to the received surrounding information, change a stored reference level to the determined reference level when the determined reference level is different from the stored reference level, and control the communication device to send the determined reference level and a command to change reference level to the vehicle.

14. The server of claim 13, wherein the controller is configured to determine whether an ignition-off signal and SoC information of the battery are received from the vehicle when a reference level of the battery of the vehicle is changed, determine a charge level corresponding to the SoC information of the battery when it is determined that the ignition-off signal and the SoC information of the battery are received from the vehicle, and control the communication device to send notification information about battery discharge to the terminal based on the battery discharge history when the determined charge level is equal to or less than the changed reference level.

15. The server of claim 8, wherein the controller is configured to control the communication device to send notification information corresponding to caution of battery discharge to the terminal upon reception of information about the caution of battery discharge from the vehicle, and control the communication device to send notification information corresponding to danger of battery discharge to the terminal upon reception of information about the danger of battery discharge from the vehicle.

16. The server of claim 15, wherein the controller is configured to enter to a sleep state after sending at least one of the information about caution of battery discharge and the information about danger of battery discharge.

17. A control method of a server in communication with a vehicle and a terminal, the method comprising:
receiving information about battery discharge from the vehicle;
storing the received information about battery discharge in a storage medium;
controlling a communication device to send notification information about battery discharge to the terminal;
upon reception of an ignition-off signal and state-of charge (SoC) information of the battery, determining a charge level corresponding to the SoC information of the battery;
checking whether the information about battery discharge is stored in the storage medium before an ignition-on signal is received from the vehicle when the determined charge level is equal to or less than a reference level; and
sending notification information about battery discharge to the terminal when the information about battery discharge is stored in the storage medium.

18. The method of claim 17, further comprising:
blocking the notification information about battery discharge from being sent when there is a history of having received the information about battery discharge when the determined charge level is equal to or less than the reference level; and
deleting the information about battery discharge stored in the storage medium.

19. The method of claim 17, further comprising:
receiving surrounding information of the vehicle from the vehicle;
determining a reference level corresponding to the received surrounding information;
changing a stored reference level to the determined reference level when the determined reference level is different from the stored reference level; and
sending the determined reference level and an instruction to change reference level to the vehicle.

20. The method of claim 19, further comprising:
determining whether an ignition-off signal and the SoC information of the battery are received from the vehicle when a reference level of the battery of the vehicle is changed;
determining a charge level corresponding to SoC information of the battery when it is determined that an ignition-off signal and the SoC information of the battery are received;
checking whether the information about battery discharge is stored in the storage medium before an ignition-on signal is received from the vehicle when the determined charge level is equal to or less than the changed reference level;
blocking the notification information about battery discharge from being sent when the information about battery discharge is stored in the storage medium; and
sending the notification information about battery discharge to the terminal when the information about battery discharge is not stored in the storage medium.

21. The method of claim 17, further comprising:
determining a charge amount of the battery corresponding to SoC information of the battery upon reception of an ignition-on signal and the SoC information of the battery from the vehicle when the information about battery discharge has been received and stored; and
sending the determined charge amount of the battery to the terminal.

* * * * *